United States Patent
Wu

(10) Patent No.: US 10,417,473 B2
(45) Date of Patent: Sep. 17, 2019

(54) OPTICAL IMAGING SYSTEM WITH VARIABLE LIGHT FIELD FOR BIOMETRICS APPLICATION

(71) Applicant: Mei-Yen Lee, Hsin Chu (TW)

(72) Inventor: Hsien-Ming Wu, Taoyuan (TW)

(73) Assignee: Mei-Yen Lee, Hsin Chu (TW)

(*) Notice: Subject to any disclaimer, the term of this patent is extended or adjusted under 35 U.S.C. 154(b) by 140 days.

(21) Appl. No.: 15/694,477

(22) Filed: Sep. 1, 2017

(65) Prior Publication Data

US 2018/0068160 A1 Mar. 8, 2018

Related U.S. Application Data

(60) Provisional application No. 62/438,939, filed on Dec. 23, 2016, provisional application No. 62/420,041, (Continued)

(51) Int. Cl.
*G06K 9/00* (2006.01)
*H01L 27/146* (2006.01)
(Continued)

(52) U.S. Cl.
CPC ........ *G06K 9/00013* (2013.01); *G06K 9/00* (2013.01); *G06K 9/00201* (2013.01);
(Continued)

(58) Field of Classification Search
CPC ........ G06K 9/00013; G06K 9/00201; G06K 9/0008; H01L 27/156; H01L 27/14649;
(Continued)

(56) References Cited

U.S. PATENT DOCUMENTS 6,061,463 A 5/2000 Metz et al.
9,177,984 B2 11/2015 Izuha et al.
(Continued)

FOREIGN PATENT DOCUMENTS

JP 2016005862 A 1/2016
TW 201246926 A 11/2012

OTHER PUBLICATIONS

Taiwan office action issued in application 10720118520, dated Feb. 7, 2018, 11 pages.

*Primary Examiner* — Yon J Couso
(74) *Attorney, Agent, or Firm* — Muncy, Geissler, Olds & Lowe, P.C.

(57) ABSTRACT

An optical imaging system with a variable light field for a biometrics application includes: a central processing unit (CPU); a display, which is electrically connected to the CPU, displays information to a user or interacts with the user, and provides a digital light signal to an object placed upon the display, the object covers a cover region of the display, and the cover region has at least an outer region and an inner region from outside to inside; and an optical imaging device electrically connected to the CPU and disposed in or under the display, the optical imaging device receives a digital light signal reflected from the object and obtains an optical image of biometrics characteristics of the object to obtain an image sensing signal. The digital light signal has the variable light field varying from the outer region to the inner region.

19 Claims, 24 Drawing Sheets

Related U.S. Application Data filed on Nov. 10, 2016, provisional application No. 62/384,381, filed on Sep. 7, 2016.

(51) Int. Cl.
  *H01L 27/15* (2006.01)
  *H01L 27/32* (2006.01)

(52) U.S. Cl.
  CPC .... *H01L 27/1462* (2013.01); *H01L 27/14618* (2013.01); *H01L 27/14649* (2013.01); *H01L 27/156* (2013.01); *H01L 27/3234* (2013.01); *G06K 9/0008* (2013.01)

(58) Field of Classification Search
  CPC ........... H01L 27/3234; H01L 27/14618; H01L 27/1462
  See application file for complete search history.

(56) References Cited

U.S. PATENT DOCUMENTS

| | | | |
|---|---|---|---|
| 2010/0067757 | A1 | 3/2010 | Arai et al. |
| 2011/0109592 | A1* | 5/2011 | Kurokawa ............ G06F 3/0412 345/175 |
| 2012/0249829 | A1 | 10/2012 | Izuha et al. |
| 2016/0014308 | A1* | 1/2016 | Yamazaki ............ A61B 5/1171 348/77 |
| 2016/0132176 | A1 | 5/2016 | Bae et al. |
| 2017/0182567 | A1 | 6/2017 | Okude et al. |
| 2017/0316248 | A1* | 11/2017 | He ..................... G06K 9/00006 |
| 2018/0067245 | A1* | 3/2018 | Giachino ............... G02B 5/281 |
| 2018/0293452 | A1* | 10/2018 | Chung ................. G06K 9/3216 |

* cited by examiner

OPTICAL IMAGING SYSTEM WITH VARIABLE LIGHT FIELD FOR BIOMETRICS APPLICATION

This application claims priorities of U.S. Provisional Patent Application Ser. No. 62/384,381, filed on Sep. 7, 2016; No. 62/420,041, filed on Nov. 10, 2016; and No. 62/438,939, filed on Dec. 23, 2016, the entire contents of which are hereby incorporated by reference.

BACKGROUND OF THE INVENTION

Field of the Invention

The invention relates in general to an optical imaging system, and more particularly to an optical imaging system with a variable light field for a biometrics application.

Description of the Related Art

A conventional optical biometrics sensor, such as an optical fingerprint sensor, utilizes an optical imaging device, such as a CMOS image sensor (CIS) or a charge coupled device (CCD) image sensor, to sense the biometrics characteristics, wherein one lens set or an array of lens sets may be used to perform the direct optical sensing.

FIG. 1 shows a conventional optical fingerprint sensor 500, Referring to FIG. 1, which works according to the total reflection principle of light between a fingerprint FP and an optical surface plane (usually a surface plane 512 of a prism 510) in contact with the fingerprint FP, so that a fingerprint image is constructed on an image sensor 530. This sensing principle has the major drawback that the dry finger cannot be sensed to have the good continuity texture image, so that the misreading problem occurs when the minutia points are being extracted. Meanwhile, it is also necessary to provide a collimated light source 520 emitting light for the total reflection principle. This also increases the cost and the design complexity. In addition, such the sensing module is formed by assembling different members, so that the manufacturing process is time-consuming and labor-consuming, and the quality cannot be easily controlled. Thus, the mass production cannot be made and the cost is also high.

Another drawback of the conventional optical fingerprint sensor is that the size is very large and is suitable for the application occasion of the large-size product, such as an entrance security control system. When the fingerprint sensor is to be applied to a slim device, such as a mobile phone, the thickness must be limited to be smaller than 1 mm. Thus, the mainstream product at present is still the capacitive fingerprint sensor, which needs to be disposed under the button, or an opening of the front side or backside of the mobile phone needs to be formed to damage the outlook and get dirty. In addition, the capacitive fingerprint sensor also has other drawbacks. For example, if it is to be placed under the glass panel, then the capacitance between the sensing unit and the fingerprint is far smaller than 1 fF, so that the sensitivity is poor. With the development of the mobile phone, the edgeless display becomes the future trend. Thus, the capacitive fingerprint sensor further cannot be disposed under the display. With the development of the mobile phone, the edgeless display becomes the future trend. Thus, the capacitive fingerprint sensor further cannot be disposed under the display.

SUMMARY OF THE INVENTION

It is therefore an object of the invention to provide an optical imaging system with a variable light field for a biometrics application, wherein various light fields or structured lights outputted from light emitting units of a display can be used to achieve the biometrics characteristic sensing.

To achieve the above-identified object, the invention provides an optical imaging system with a variable light field for a biometrics application. The optical imaging system includes; a central processing unit (CPU); a display, which is electrically connected to the CPU, displays information to a user or interact with the user, and provides a digital light signal to an object placed upon the display, wherein the object covers a cover region of the display, and the cover region has at least one outer region and an inner region from outside to inside; and an optical imaging device, which is electrically connected to the CPU and disposed in or under the display, wherein the optical imaging device receives the digital light signal reflected from the object and obtains an optical image of biometrics characteristics of the object to obtain an image sensing signal, wherein the digital light signal has the variable light field varying from the outer region to the inner region.

With the above-mentioned embodiment, it is possible to provide an optical imaging system with a variable light field for a biometrics application, which is integrated with the display of the electronic apparatus. Thus, various light fields outputted from the light emitting units of the display can be used (to provide the light field with the gradually increasing brightness in the region covered by the object from outside to inside through the array of point light sources independently corresponding to each of the pixels) or the structured light can be used (to output different light fields of light sources at different time points) to achieve the biometrics characteristic sensing, and achieve the displaying, touch and biometrics sensing effects concurrently.

Further scope of the applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE INVENTION

The main spirit of the following application examples relates to a structure of an integrated sensing module, wherein the semiconductor wafer manufacturing method is utilized to stack the optical module onto the optical sensing chip by way of wafer stacking to complete the structure thereof and overcome all the drawback of the prior art, so that the size is minimized, the manufacturing processes are standardized, the quality is easily controlled, and the cost is advantageously decreased.

Figure 1:
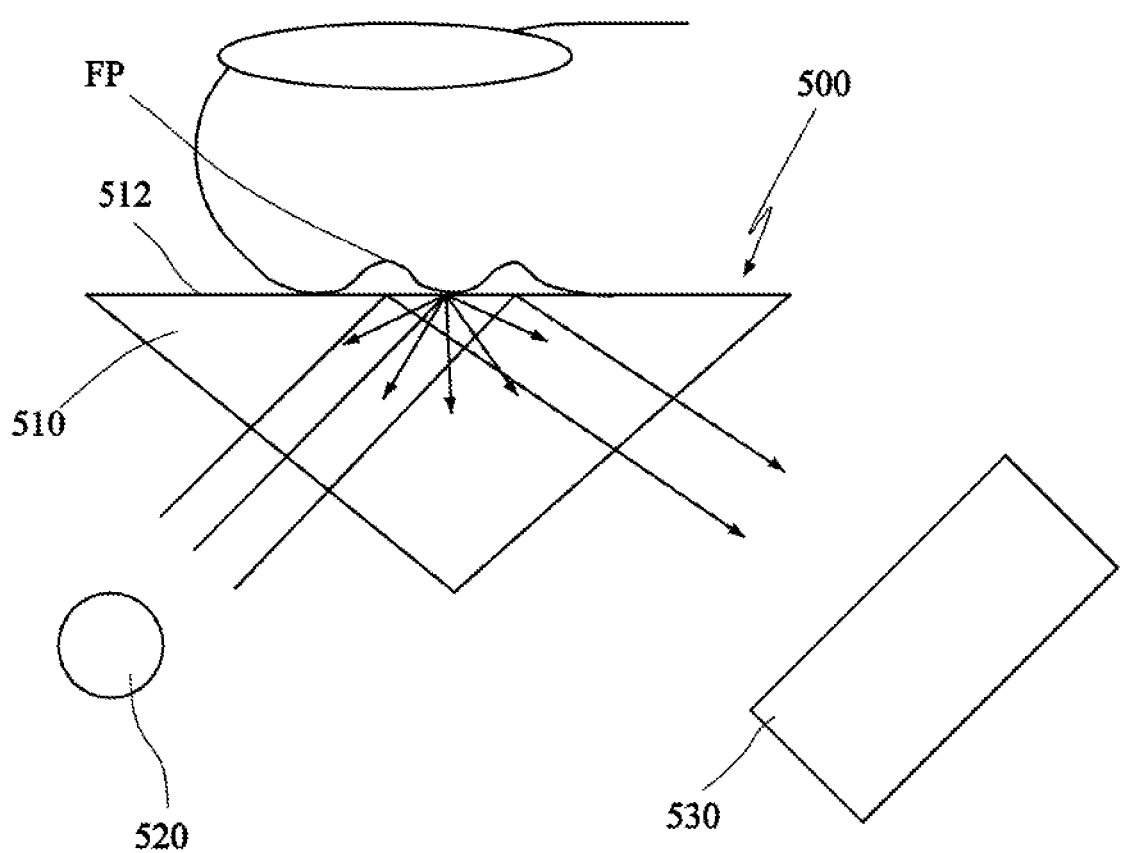
FIG. 1 shows a conventional optical fingerprint sensor.
Figure 2A:
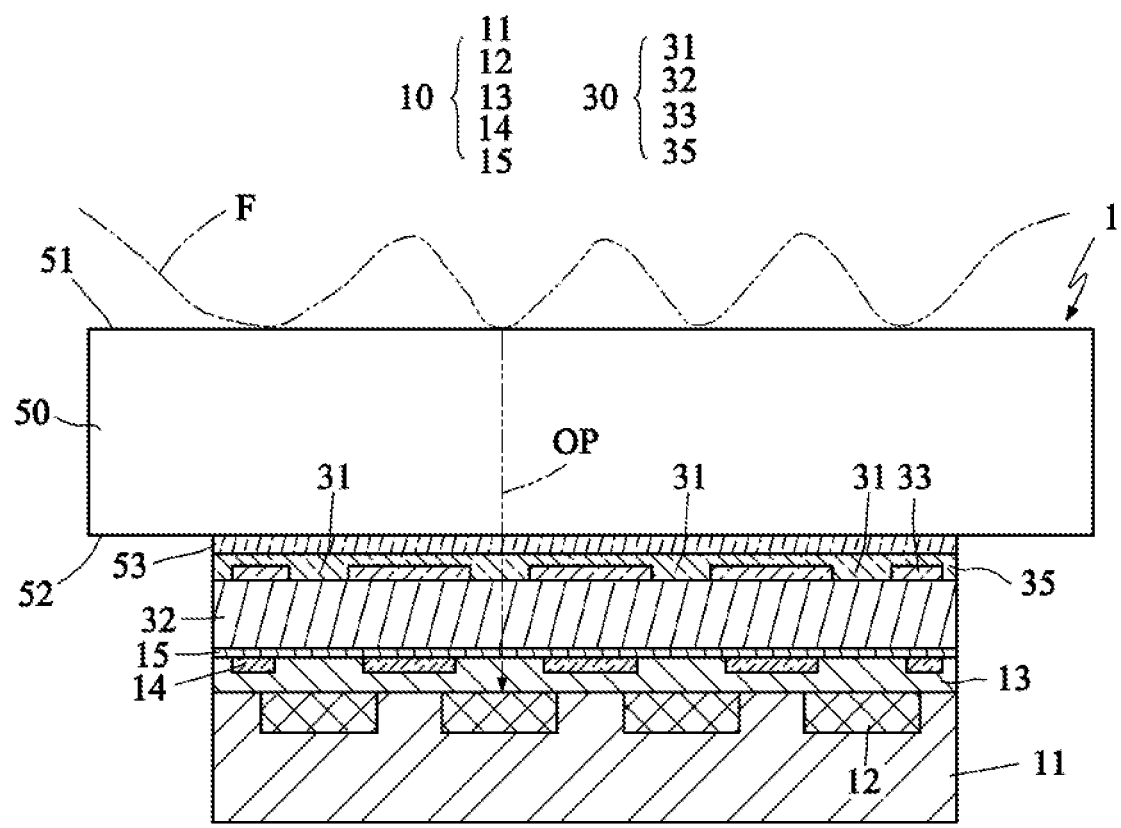
FIG. 2A is a schematic view showing an integrated sensing module according to a first application example of the present invention.

FIG. 2A is a schematic view showing an array image sensing module or an integrated sensing module 1 according to a first application example of the present invention. Referring to FIG. 2A, the array image sensing module 1 includes: an image sensing chip 10, including photo sensing units 12 arranged in a two-dimensional array; and a micro-hole layer 30 disposed on the image sensing chip 10 and having multiple micro holes 31 arranged in a two-dimensional micro-hole array, the micro holes 31 corresponding to the photo sensing units 12 (may be a one-to-one, one-to-many or many-to-one geometric arrangement to match with the system design upon application without departing from the basic architecture and principles of the invention), wherein the photo sensing units 12 sense an optical image of an object F through the micro holes 31 (through the light path OP). The optical image can be a skin/dermal fingerprint image, a subcutaneous vein image and/or the array image sensing module may measure other biometrics images or information, such as blood oxygen concentration, heartbeat information or the like.

The image sensing chip 10 includes a semiconductor substrate 11 and the photo sensing units 12 formed in the substrate 11, and can further include an inter-metal dielectric (IMD) layer set 13 (there may actually be multiple IMD layers and metal connection layers disposed on the substrate and the photo sensing units), an upper metal layer 14 (disposed on the IMD layer set 13) and a protection layer 15 (disposed on the IMD layer set 13 and the upper metal layer 14). The upper metal layer 14 may be used as a light obstructing layer for obstructing partial light rays from the micro holes 31 to the photo sensing units 12 to avoid the light rays from mutual interfering with each other as well as to restrict the light path and/or light amount. The protection layer 15 is, for example, silicon oxide/silicon dioxide or other insulating layer materials for covering the upper metal layer 14.

Figure 2B:
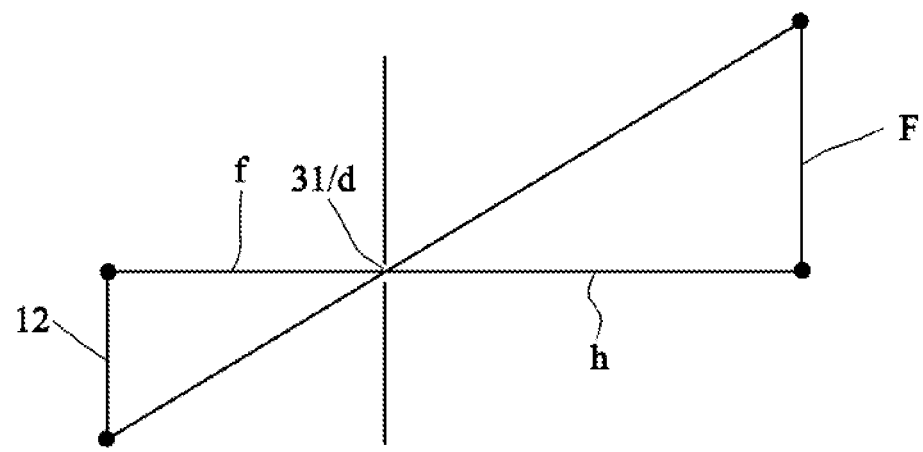
FIG. 2B is a schematic view showing micro-hole imaging.

FIG. 2B is a schematic view showing micro-hole imaging. The invention uses the principle of the micro-hole imaging, and the formula used to calculate the optimal diameter of the micro-hole s is as follows:

$$d=\sqrt{2f\lambda}$$

where f is a focal length, and λ is a wavelength of light. The wavelength of the red light is 700 nm, the wavelength of the green light is 546 nm, and the wavelength of the blue light is 436 nm. The average of the wavelengths of the red light and the green light (that is, 623 nm) is usually taken upon calculation.

The focal lengths from the micro holes 31 to the photo sensing units 12 depend on the system design and range between 100 and 1000 microns (um), especially between 150 and 600 um. The following shows some of the calculated results.

| f (um) | λ (nm) | d (um) | Remarks |
|---|---|---|---|
| 150 | 940 | 16.79286 | infrared light |
| 300 | 940 | 23.74868 | infrared light |
| 150 | 700 | 14.49138 | red light |

-continued

| f (um) | λ (nm) | d (um) | Remarks |
|---|---|---|---|
| 300 | 700 | 20.4939 | red light |
| 150 | 546 | 12.79844 | green light |
| 300 | 546 | 18.09972 | green light |
| 150 | 436 | 11.43678 | blue light |
| 300 | 436 | 16.17405 | blue light |

The calculated aperture "d" of the micro hole 31 may be between about 10 and 25 um. Of course, such the scale can be implemented using the current semiconductor lithography technology.

As shown in FIG. 2A, the array image sensing module 1 further includes a transparent cover 50 disposed on the micro-hole layer 30, wherein the object F is in contact with an upper surface 51 of the transparent cover 50, and the array image sensing module 1 and the transparent cover 50 can be referred to as the integrated sensing module. An adhesive agent 53 (it is of course not limited to a single layer of material, and may also be referred to as an adhesive layer) adheres a lower surface 52 of the transparent cover 50 to a protection layer 35 (the protection layer 35 may also be omitted in another application example). The transparent cover 50 is not an essential element, because other structures may also be adopted to make the image sensing chip 10 sense the optical image. In this application example, the transparent cover 50 can be a display cover of the mobile phone. This represents that the array image sensing module is disposed under the display cover of the mobile phone (referred to as an under glass module), or the transparent cover is not limited to a single homogeneous material, and may be a multi-layers heterogeneous combination, such as an OLED display panel assembly structure having a partial transparent design to facilitate the light path OP to pass. This represents that the array image sensing module is disposed under the display of the mobile phone (referred to as an under display module), especially a portion of an organic light emitting diode (OLED) display or micro light-emitting diode (LED) display.

Figure 5:
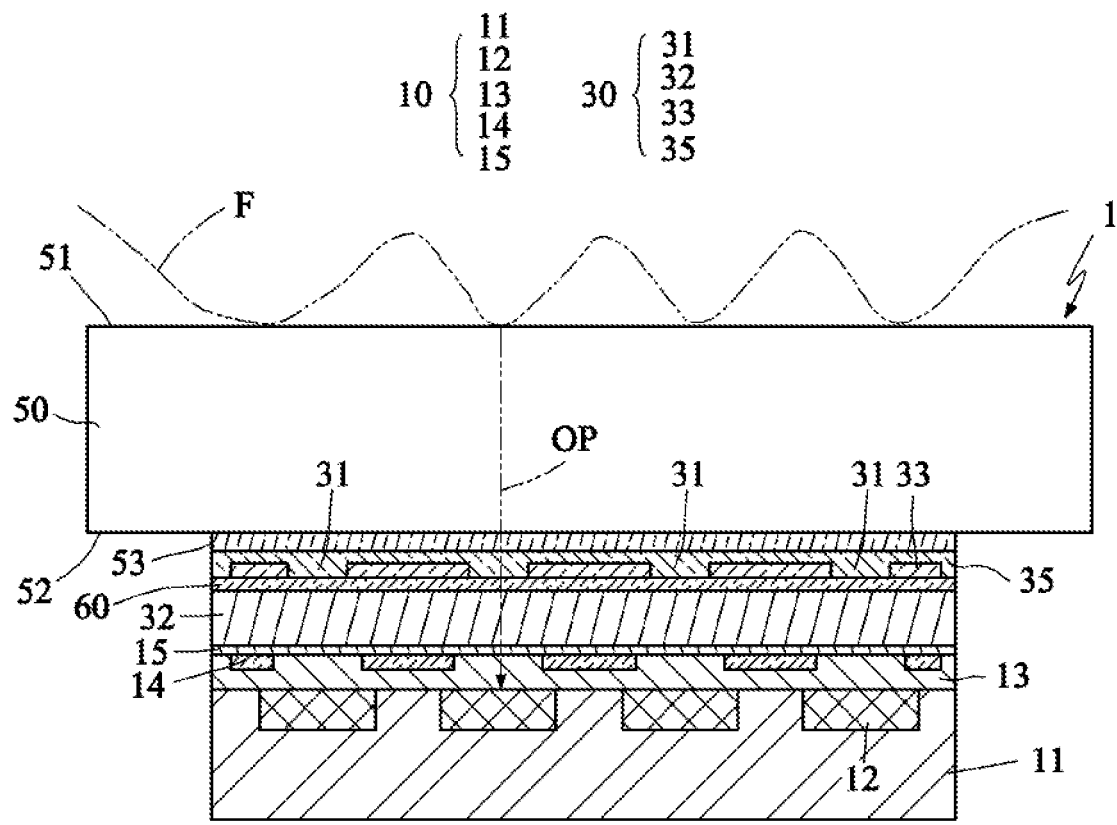
FIG. 5 is a schematic view showing a modified example of the integrated sensing module of FIG. 2.

The micro-hole layer 30 may be formed of a transparent substrate 32 and a patterned metal layer 33 formed on the transparent substrate 32, wherein the top surface of the patterned metal layer 33 can be covered with the protection layer 35, and the protection layer 35 may also be omitted in another application example. In addition, the protective layer itself may also be an optical filter only let specific wavelengths of light (e.g., infrared light) pass, or an optical filter 60 may be disposed between the transparent substrate 32 and the patterned metal layer 33, as shown in FIG. 5, or the optical filter 60 may be disposed between the image sensing chip 10 and the transparent substrate 32 or above the patterned optical substrate (not shown, wherein the optical filter may also be regarded as not pertaining to one portion the micro-hole layer). The transparent substrate material is, for example, glass, quartz and sapphire and so on. The advantage of the invention adopted is, as compared with the condition using the polymeric material, the difference between the coefficients of thermal expansion of the transparent substrate material and the sensing chip substrate (e.g., silicon or the like) is smaller, and the generated thermal stress is relatively low, so that the stable quality is obtained.

The thickness of the transparent cover 50 ranges between 300 and 1000 um, preferably between 500 and 900 um, more preferably between 600 and 800 um, much more preferably between 650 and 750 um, and is most preferably equal to about 700 um. However, this does not intend to restrict the invention thereto.

The manufacturing method will be described below.

Figure 3A:
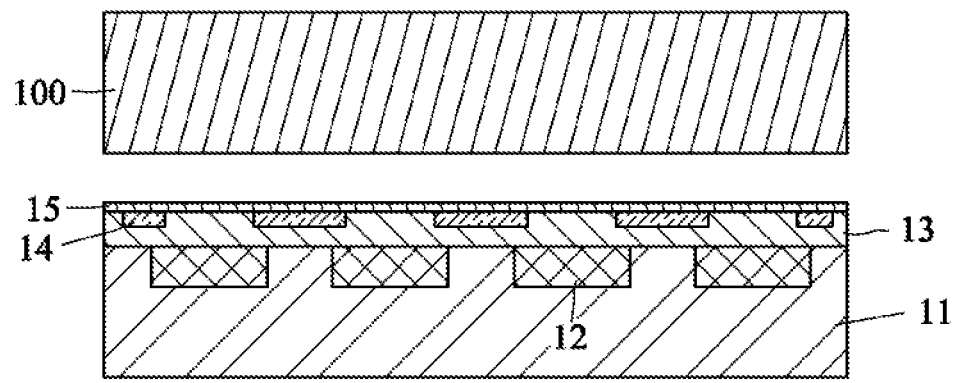
FIGS. 3A to 3F are schematic views showing steps in a method of manufacturing the integrated sensing module according to the preferred application example of the invention.
Figure 3B:
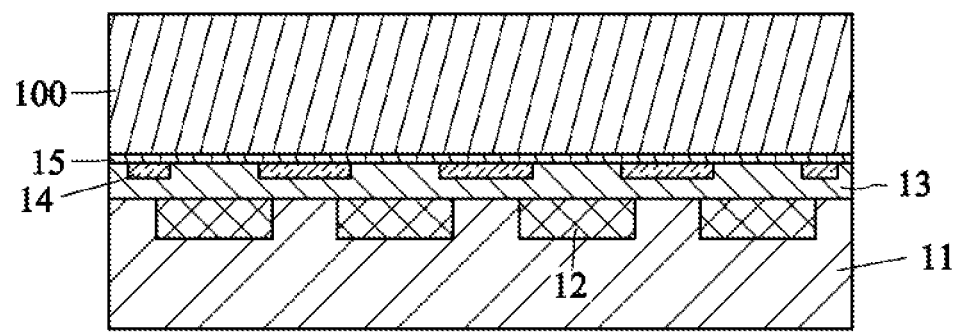

As shown in FIG. 3A, the manufacturing of the invention is wafer level manufacturing. For the sake of illustration, the schematic scale of the partial chip is described herein. First, an image sensing chip 10, such as but without limitation to a CMOS Image Sensor (CIS) fabricated using a CMOS process, is provided. Then, a transparent substrate 100 is bonded to the image sensing chip 10, as shown in FIG. 3B, wherein the low-temperature fusion bonding, adhering or other technology may be used. Alternatively, multiple array image sensing modules 1 may also be manufactured at a time using the wafer level manufacturing technology. In this case, a first wafer (the silicon wafer is used in this application example but provides no limitation while the image chip may be of the front-side illumination (FSI) or back-side illumination (BSI)) including multiple image sensing chips 10 is firstly provided. Then, a second wafer (transparent substrate 100) is bonded to the first wafer. Next, the following steps are performed, and finally dicing is performed. For the sake of simplicity, the production of the single array image sensing module 1 will be described in the following.

Figure 3C:
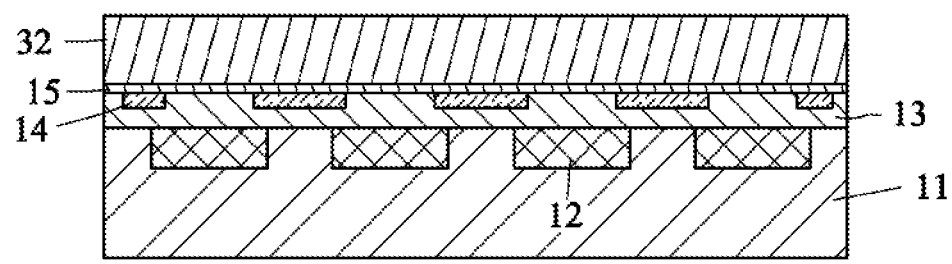

Then, as shown in FIG. 3C, the transparent substrate 100 is thinned down by way of grinding, polishing or surface treatment to produce the transparent substrate 32 with the predetermined thickness. Because this thickness is very close to the focal length f, using the semiconductor wafer manufacturing process to control is further advantageous to the increases of the yield and quality as compared with the conventional machining and assembling method.

Figure 3D:
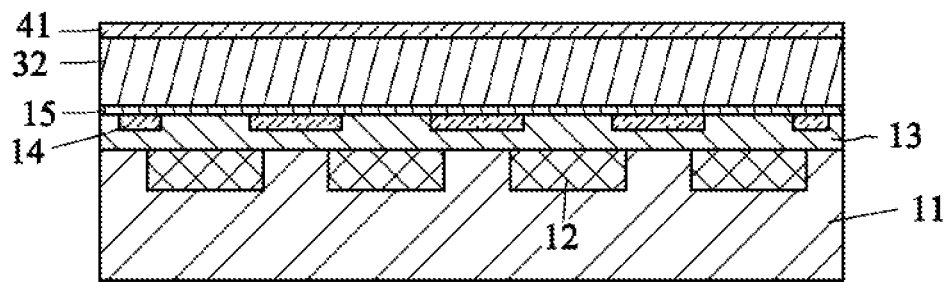
Figure 3E:
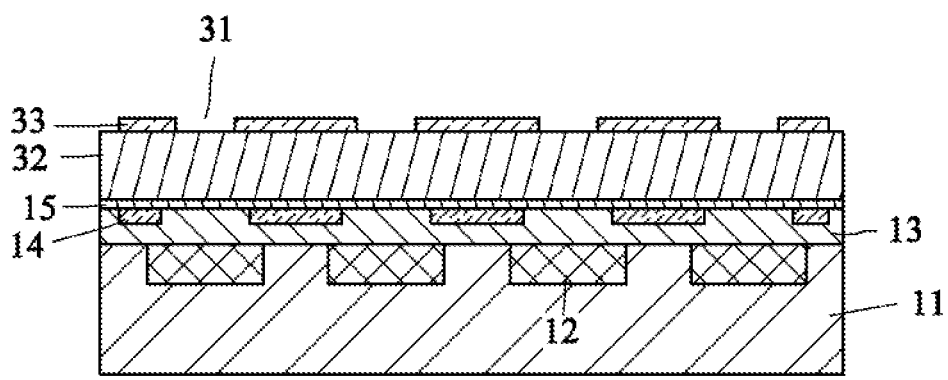

Next, as shown in FIG. 3D, a metal layer 41 is formed on the transparent substrate 32, and then the photoresist is coated, exposed, developed and etched to pattern the metal layer 41 and to form the patterned metal layer 33, and then the remained photo resist layer is removed, as shown in FIG. 3E.

When the optical filter 60 is disposed between the transparent substrate 32 and the patterned metal layer 33, as shown in FIG. 5, an optical filer 60 may be formed on the transparent substrate 32 first, and then the step of forming the metal layer 41 on the optical filter 60 and the associated steps are performed, wherein detailed descriptions thereof will be omitted. The above-mentioned step may be interpreted as forming a patterned optical substrate on the image sensing chip.

Figure 3F:
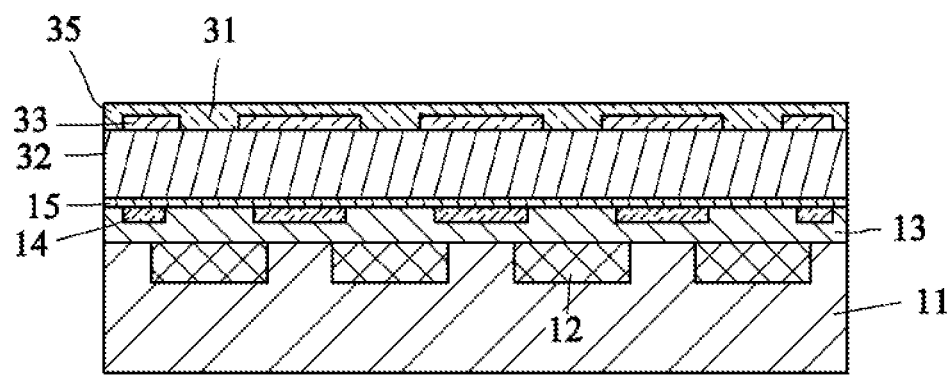

Then, as shown in FIG. 3F, the protection layer 35 is formed on the patterned metal layer 33 and the transparent substrate 32. In practical application, the adhesive agent 53 can be used to adhere the protection layer 35 to the transparent cover 50, such as the display module or the cover glass of the mobile phone.

Figure 4A:
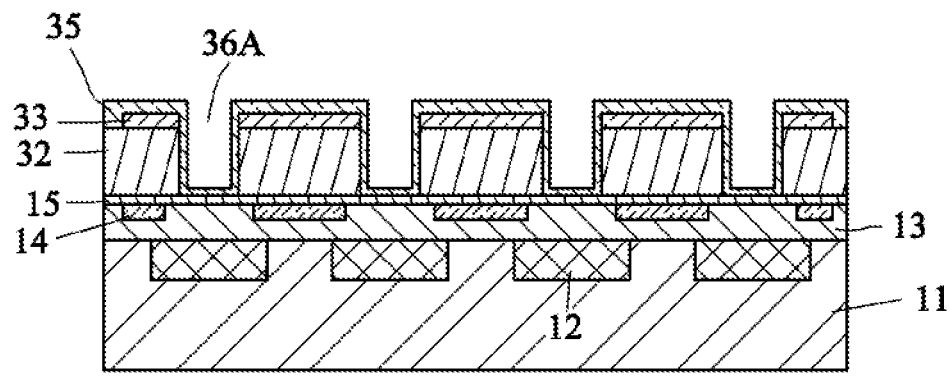
FIGS. 4A to 4F are schematic views showing multiple examples of the transparent substrate.
Figure 4B:
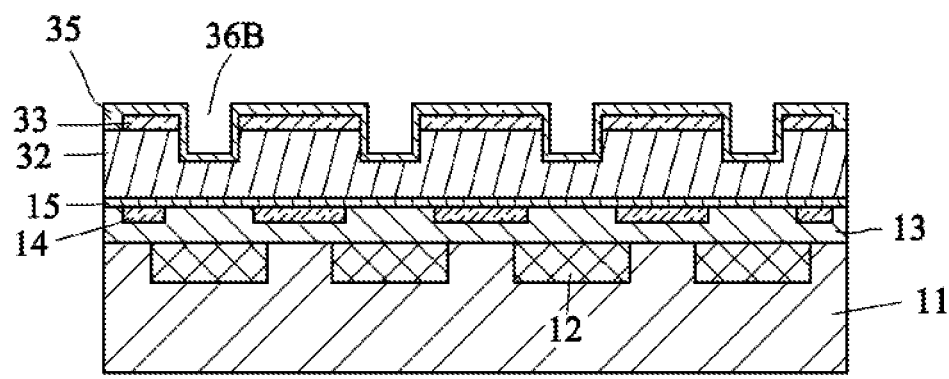
Figure 4C:
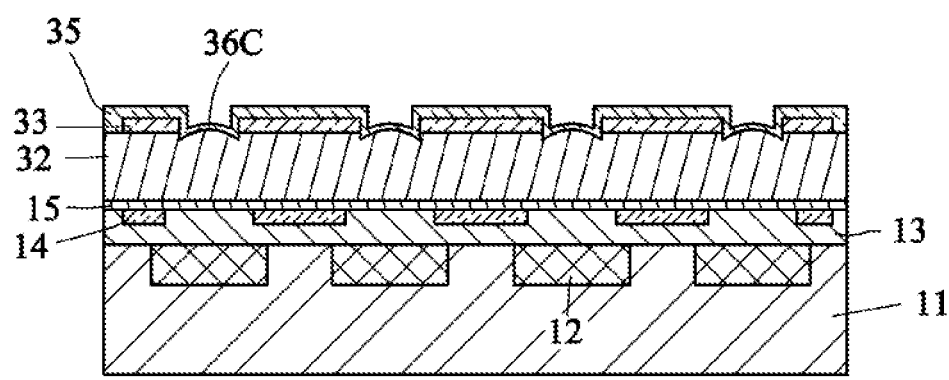
Figure 4D:
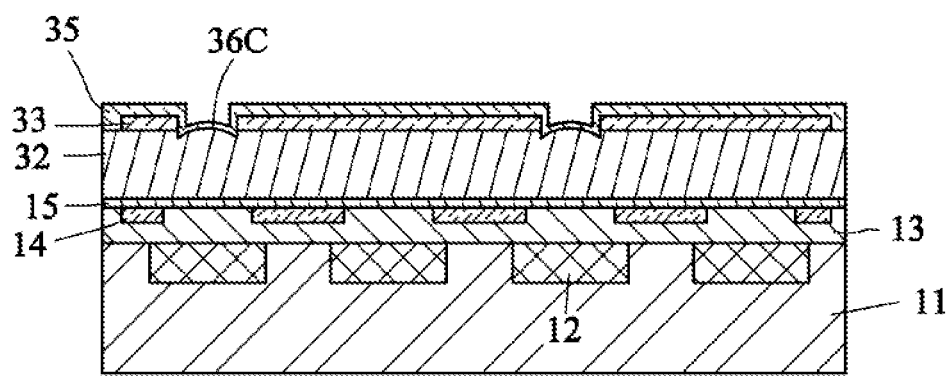
Figure 6:
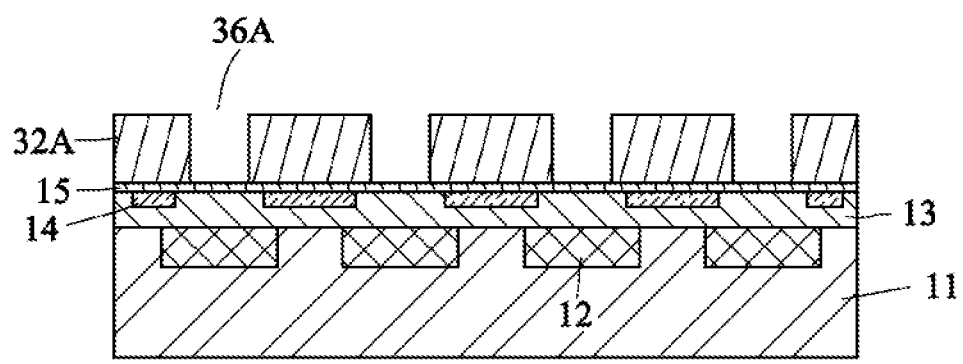
FIG. 6 is a schematic view showing another modified example of the transparent substrate.

The transparent substrate 32 may be solid (FIG. 3F), hollow (FIG. 4A, formed with a deep trench 36A), or the mixture of solid and hollow structures (FIG. 4B, formed with a shallow trench 36B). The transparent substrate 32 may also provide the light gathering or converging (the convex curved surface 36C of FIG. 4C) or light diverging (similar to FIG. 4C, not shown) effect to further adjust the light path. As shown in FIG. 4D, all first portions of the transparent substrate 32 corresponding to the micro holes 31 have the light converging or diverging effect, while the second portions thereof do not have the light converging or diverging effect, so that different depths of images can be sensed. Of course, if the hollow design as shown in FIG. 4A is adopted, then the transparent substrate 32 may also be replaced with an opaque substrate 32A (e.g., silicon substrate or the like). At this time, the protection layer 35 and the patterned metal layer 33 can be omitted to have the structure shown in FIG. 6. In this case, only the opaque substrate 32A needs to be patterned. The transparent substrate 32 and the opaque substrate 32A may also be generalized as an optical substrate, so the micro-hole layer includes a patterned optical substrate, wherein the patterned structure may be formed by etching through the optical substrate, etching the optical substrate with etching through the optical substrate or using a patterned light-obstructing or black glue layer to cover the optical substrate to form the associated corresponding structure of the micro hole(s). For example, the patterned optical substrate may be the combination of the transparent substrate 32 and the patterned metal layer 33, but the invention is not restricted thereto.

Figure 4E:
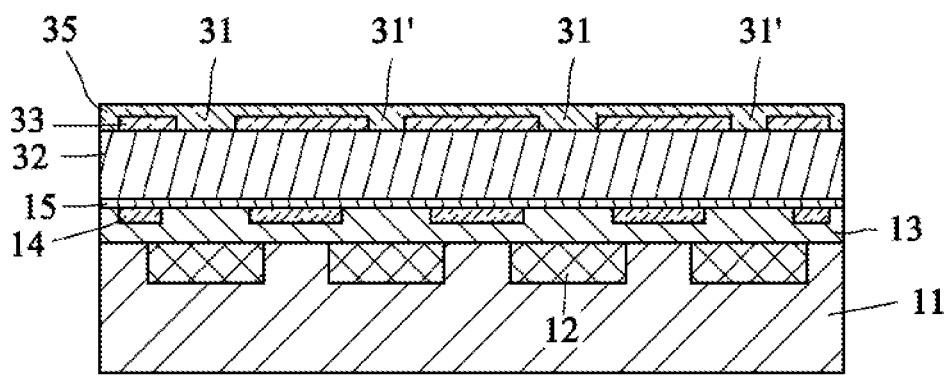

As shown in FIG. 3F, all the micro holes 31 have the same aperture (d). As shown in FIG. 4E, the micro holes 31 and 31' have different apertures (d), such as two, three or four sets of apertures (d) arranged alternately, and work in conjunction with different wavelengths of light sources, so that different depths of images can be sensed. For example, the skin layer, the dermal layer and the finger vein images are sensed concurrently. Such the design cannot be made in the conventional optical sensing module, and is another characteristic of the invention. This concept is also applicable to FIGS. 4A, 4B, 4C, 4D and 6.

Figure 4F:
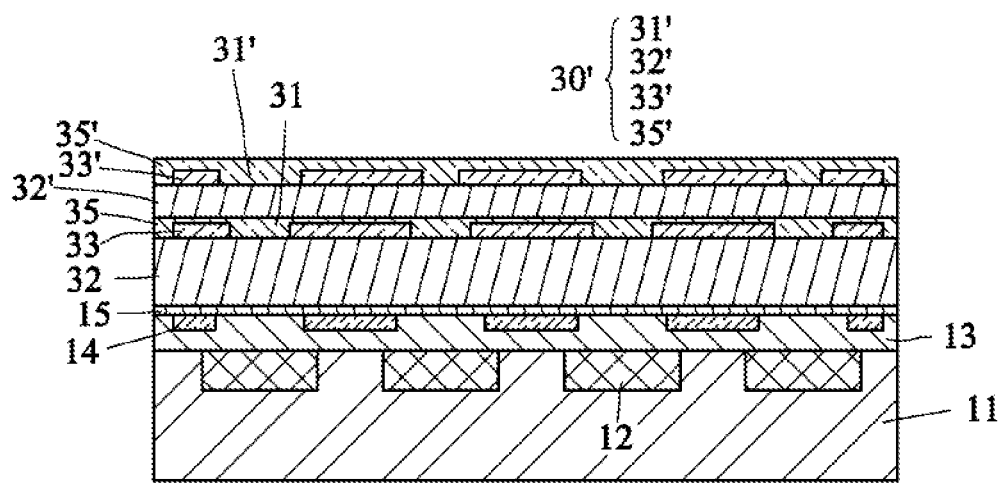

As shown in FIG. 4F, different sizes of micro holes 31 and 31' of two sets of micro-hole layers 30 and 30' are utilized to achieve the effect of sensing different depths of images. It is possible to manufacture the product by performing the manufacturing method similar to FIGS. 3A to 3F based on the structure of FIG. 3F to form a transparent substrate 32', a patterned metal layer 33' and a protection layer 35' of another micro-hole layer 30' on the protection layer 35 in order.

The invention also provides an electronic apparatus installed with the above-mentioned array image sensing module, wherein the electronic apparatus may be the mobile phone or the tablet computer etc., and the transparent cover 50 is the display (especially the touch display) of the electronic apparatus, more particularly an organic light emitting diode (OLED) display or micro light-emitting diode (LED) display.

In order to sense the biometrics image, the integrated sensing module itself must have the array sensing member structure, which is also referred to as an array image sensing module.

Figure 7:
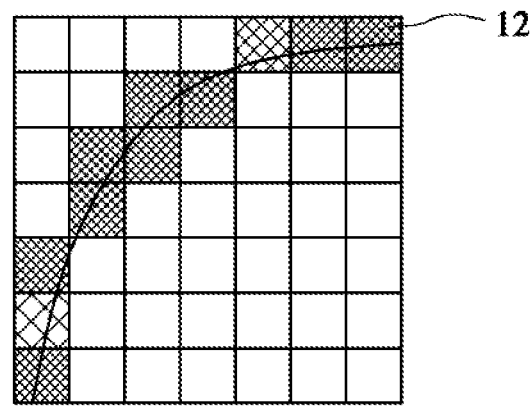
FIG. 7 shows one example of gray scale values of the photo sensing unit put together into an image.

In the above-mentioned application example, the micro holes correspond to the photo sensing units in a one-to-one manner. Thus, the sensing value obtained by each photo sensing unit and the imaging through each micro hole only has the gray scale. Putting the sensing values of all the photo sensing units through the imaging of all the micro holes can obtain the biometrics image, as shown in FIG. 7, which shows one example of gray scale values of the photo sensing unit put together into an image. It is worth noting that all the above-mentioned similar characteristics are applicable to the following integrated sensing module.

The following application example provides an integrated sensing module, wherein one micro hole corresponds to many photo sensing units. Thus, the photo sensing unit can obtain the biometrics image through the imaging principle of one micro hole.

Figure 8:
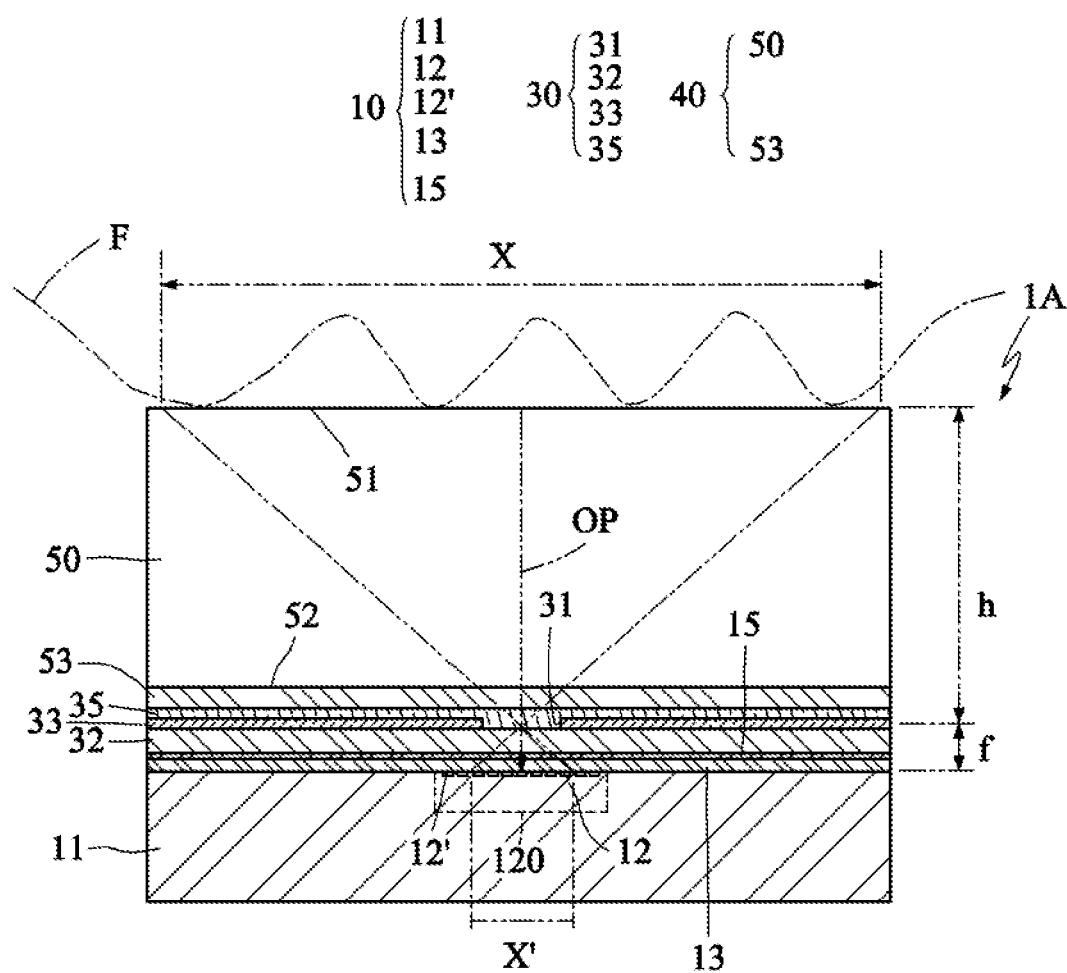
FIG. 8 is a schematic view showing an integrated sensing module according to a second application example of the invention.

The invention is directed to the wafer level manufacturing. For the sake of illustration, the schematic scale of the partial chip is described herein. First, an image sensing chip 10 is provided by, for example but without limitation to, the CMOS process for manufacturing the CMOS image sensor (CIS). FIG. 8 is a schematic view showing an integrated sensing module 1A according to the second application example of the invention. Referring to FIG. 8, the integrated sensing module 1A of this application example includes: an image sensing chip 10 including photo sensing units 12 arranged in a two-dimensional array; a micro-hole layer 30 disposed on the image sensing chip 10 and having a micro hole 31 corresponding to the photo sensing units 12; and a transparent cover assembly 40 disposed on the micro-hole layer 30, wherein the photo sensing units 12 sense, through the micro hole 31, an optical image of an object F disposed on or over the transparent cover assembly 40.

The reason of including the transparent cover assembly 40 is that the size of the overall integrated sensing module (that is, the relative distance between the object space and the image space) must be defined. The transparent cover assembly 40 defines the object distance, and the image distance is defined from the micro-hole layer 30 to the photo sensing unit 12, so that the micro-hole imaging effect can be presented. The image sensing chip 10 may further include additional photo sensing unit 12' disposed on one or multiple sides of the photo sensing units 12. The advantage is that the image sensing chip 10 still can operate normally even if the alignment state is not obtained upon assembling. The photo sensing units 12' and 12 constitute an image sensor 120. In addition, the invention adopts the single micro hole imaging, and another important relationship thereof is that the object dimension X in the object space is not necessarily equal to the image dimension X' in the image space (unless f/h=1), that is, X'/X=f/h (if the imaging aberration is not considered). Of course, the aberration is present in the actual situation, and may affect the detected resolution S in the object space. This represent that the actual physical analytic geometry of the imaging system for imaging the fingerprint, for example, if the resolution must satisfies 500 dpi, then S in the object space must be about 50 um. If the aberration is considered, then S=d(X/X'+1), where d is the aperture of the micro hole. Thus, the whole design rule can be obtained. Thus, the application example of the invention is designed based on the principle of satisfying the above-mentioned formula.

In addition, the transparent cover assembly 40 may further be provided with a filter (such as an anti-reflection coating (ARC) layer, a specific light pass layer or the like) disposed on a top surface, a bottom surface or a middle portion of the transparent cover assembly 40. The micro-hole layer 30 may also be provided with a filter disposed on a top surface, a bottom surface or a middle portion of the micro-hole layer 30.

The micro-hole layer 30 and the material of each layer of the transparent cover assembly 40 have the same refractivity or similar refractivities (the difference therebetween ranges between 0% and 30%), so that the light rays can travel in almost the straight line direction. Alternatively, the equivalent refractivity of the micro-hole layer 30 and the equivalent refractivity of the transparent cover assembly 40 are the same or close to each other, and the same effect may also be achieved.

The detailed structure will be described in the following. The image sensing chip 10 includes: a substrate 11, in which the photo sensing units 12 are formed; an inter-metal dielectric layer set 13 formed on the substrate 11, and a first protection layer 15 formed on the inter-metal dielectric layer set 13.

In addition, the micro-hole layer 30 includes: a transparent substrate 32 bonded to the first protection layer 15; a patterned metal layer 33, in which the micro hole 31 is formed; and a second protection layer 35 formed on the transparent substrate 32 and the patterned metal layer 33. It is worth noting that the patterned metal layer 33 may also be replaced with an opaque material layer.

The transparent cover assembly 40 includes, a transparent cover 50; and an adhesive agent 53 adhering the transparent cover 50 to the micro-hole layer 30. An upper surface 51 of the transparent cover 50 touches or approaches the object F. A lower surface 52 of the transparent cover 50 is adhered, by the adhesive agent 53, to the second protection layer 35.

In this application example when the aberration is not considered, (the thickness of the transparent cover assembly (including the adhesive) 40)/(the total thickness of the transparent substrate of the micro-hole layer 30, the inter-metal dielectric layer set 13 and the first protection layer 15)=(the sensed surface area of the object F)/(the area imaged on the photo sensing units 12). This is the dimensional relationship between the similar triangles caused by the micro-hole imaging principle to achieve the micro-hole imaging effect. It is worth noting that the manufacturing method of the second application example is similar to the first application example, and detailed descriptions thereof will be omitted.

Figure 9:
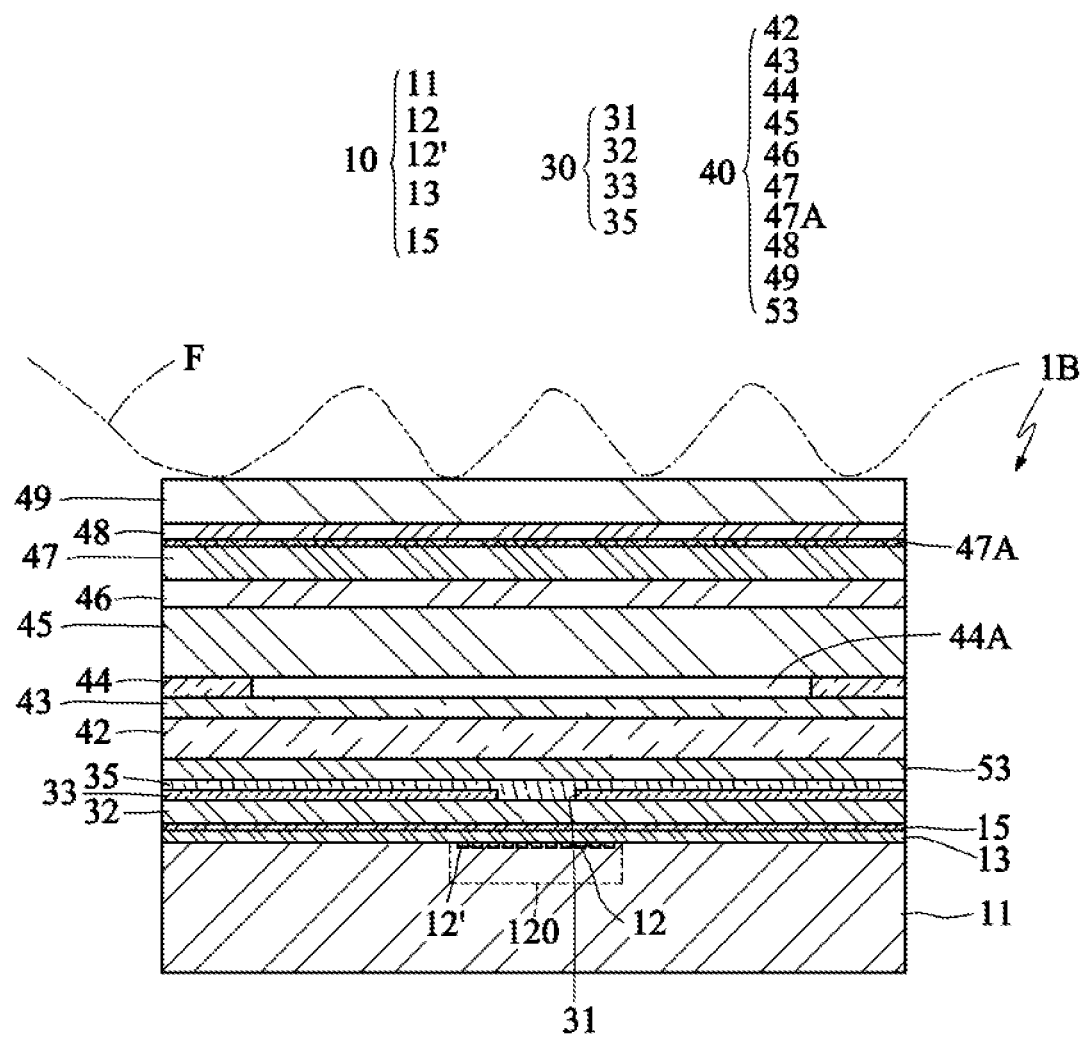
FIG. 9 is a schematic view showing an integrated sensing module according to a third application example of the invention.

FIG. 9 is a schematic view showing an integrated sensing module 1B according to a third application example of the invention. As shown in FIG. 9, this application example is similar to the second application example except for the difference that the transparent cover assembly 40 is a portion of an organic light emitting diode (OLED) display or a micro light-emitting diode (LED) display. Thus, the display may provide the light source to illuminate the object.

In this application example, the transparent cover assembly 40 includes: an adhesive agent 53; a lower glass plate 42 adhered, by the adhesive agent 53, to the second protection layer 35; a thin film transistor (TFT) layer set (including the protection material of the topmost layer) 43 disposed on the lower glass plate 42; a cathode layer 44, which is disposed on the TFT layer set 43 and has a stop (aperture) 44A; an organic active layer or micro LED layer 45 disposed on the cathode layer 44; an indium tin oxide (ITO) anode layer 46 disposed on the organic active layer or micro LED layer 45; an upper glass plate 47 disposed on the ITO anode layer 46; a polarizer layer 47A disposed on the upper glass plate 47; an adhesive layer 48 disposed on the polarizer layer 47A, and a transparent cover 49 disposed on the adhesive layer 48. The adhesive layer 48 adheres the polarizer layer 47A to the transparent cover 49. The transparent cover 49 is an element approaching or touching the object F. Of course, the above-mentioned description, such as the OLED display structure, may have the increase or decrease of the material layer with the development of the technology, and the spirit of the invention is not changed accordingly.

That is, the image sensing chip 10 of the second application example and the micro-hole layer 30 are in contact with the underside of the OLED or Micro LED display (under display), and this application example can be completed. The stop 44A is used to transmit the light and restrict the light amount, and does not directly relate to the pin hole imaging principle. Because the cathode layer 44, such as the aluminum layer, occupies the relatively large area of the display for the purpose of reflecting the light rays of the organic active layer or micro LED layer 45 upwards back to enhance the luminance, the cathode layer 44 is opaque. Thus, one stop 44A needs to be formed for the photo sensing unit 12. Of course, the stop 44A may also be accomplished by the material of the existing OLED structure layer, or by adding a new structure layer, such as a black glue layer. This has the flexibility in manufacturing, and does not restrict the spirit of the invention.

Figure 10:
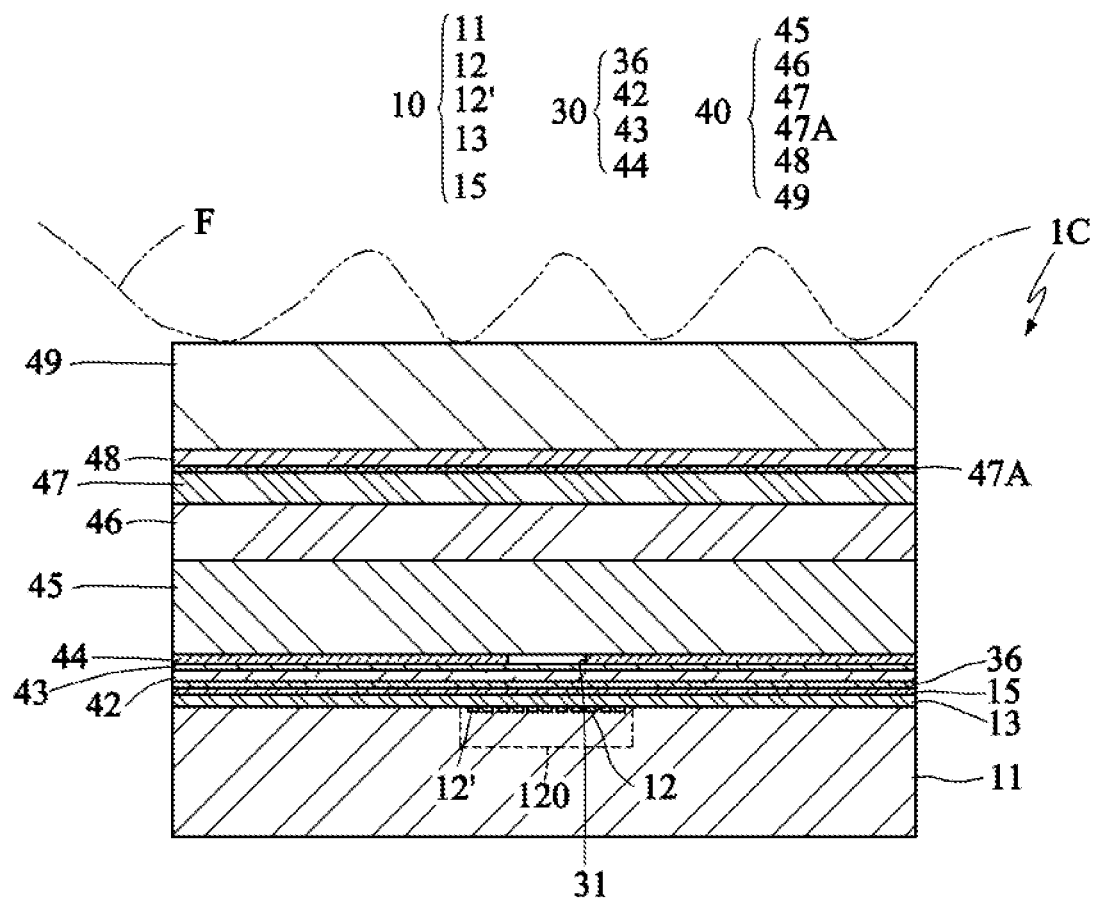
FIG. 10 is a schematic view showing an integrated sensing module according to a fourth application example of the invention.

FIG. 10 is a schematic view showing an integrated sensing module 1C according to a fourth application example of the invention. Referring to FIG. 10, this application example is similar to the second application example except for the difference that the transparent cover assembly 40 and the micro-hole layer 30 constitutes a portion of an OLED display or a micro LED display.

In this application example, the micro-hole layer 30 includes, an adhesive agent 36 (also referred to as an adhesive layer); a lower glass plate 42, wherein the adhesive agent 36 adheres the lower glass plate 42 to the first protection layer 15; a TFT layer set 43 disposed on the lower glass plate 42; and a cathode layer 44 having the micro hole 31. Of course, this micro hole 31 may be accomplished by the material of the existing OLED structure layer, or by adding a new structure layer, such as a black glue layer. This has the flexibility in manufacturing, and does not restrict the spirit of the invention.

The transparent cover assembly 40 includes: an organic active layer or micro LED layer 45 formed on the cathode layer 44; an ITO anode layer 46 formed on the organic active layer or micro LED layer 45; an upper glass plate 47 formed on the ITO anode layer 46; a polarizer layer 47A disposed on the upper glass plate 47; an adhesive layer 48 disposed on the polarizer layer 47A; and a transparent cover 49 disposed on the adhesive layer 48. The adhesive layer 48 adheres the transparent cover 49 to the polarizer layer 47A. Thus, the display may provide the light source to the object F. Alternatively, another light source may also be disposed on one or multiple sides of the transparent cover assembly to input the infrared light (the display cannot provide the infrared light) or other special wavelengths of light.

Figure 11:
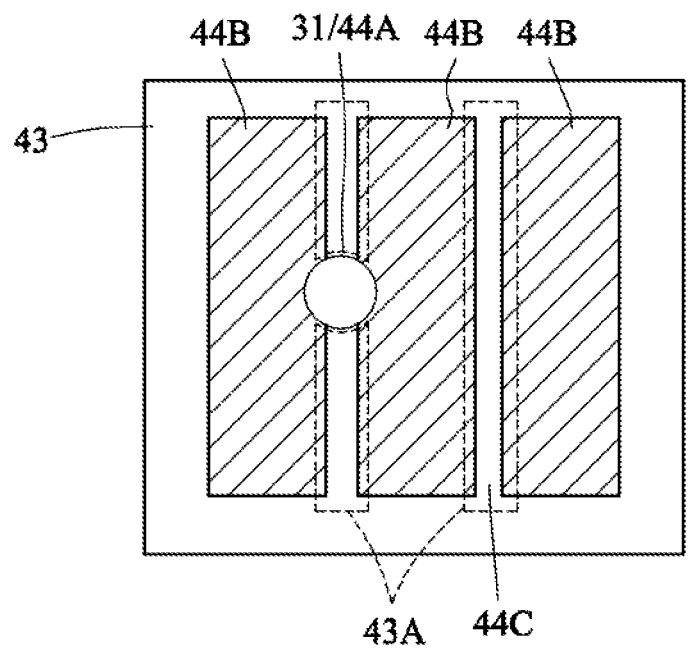
FIGS. 11 and 12 show two examples of formation positions of stops or micro-holes.
Figure 12:
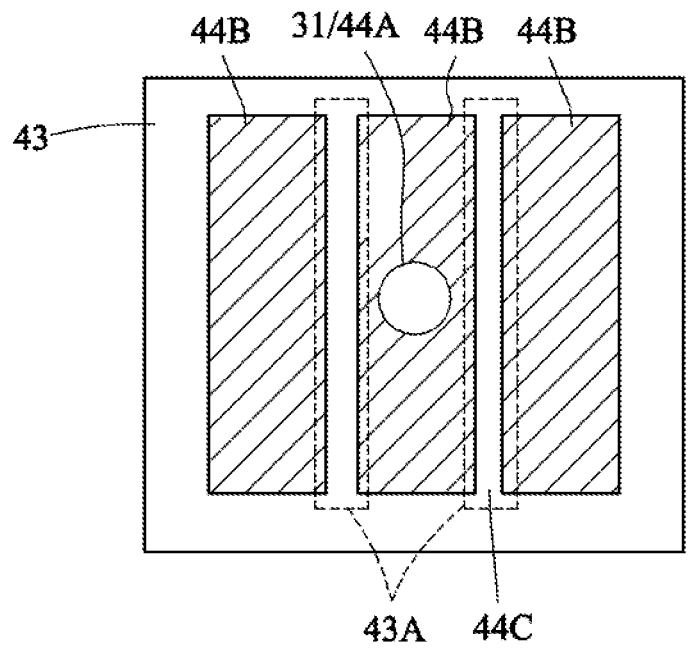

FIGS. 11 and 12 show two examples of formation positions of the stops 44A or micro-holes 31. As shown in FIG. 11, the stop 44A or the micro hole 31 is formed in and between two electrode plates 44B of the neighboring cathode layers 44, so the TFT layer set 43 under the cathode layer 44 also provide a portion for the formation of the stop 44A or micro hole 31. In one example, the horizontal width of one single electrode plate 44B is about 30 um (microns), and the horizontal gap between the two electrode plates 44B is about 2 to 3 um. The dimension of the stop 44A or the micro hole 31 is about 10 to 25 um, so the stop or micro hole needs to cross two electrode plates 44B. As shown in FIG. 12, the stop 44A or the micro hole 31 may also be completely formed in one single electrode plate 44B, but the TFT layer set 43 under the electrode plate 44B also needs to provide a transparent or hollow portion to let the light rays pass.

It is worth noting that the gap 44C between the electrode plates 44B of the cathode layer 44 of FIG. 11 may be designed to obstruct the light and form the opaque state through the light obstructing layer 43A formed by the conductor of the TFT layer set 43 (e.g., the polysilicon) to prevent the diffraction light from affecting the sensing effect of pin hole imaging. It is worth noting that the light obstructing layer 43A is not designed in the single OLED or micro LED display, but has the effect and value in this application example in order to prevent the diffraction light from affecting the sensing effect of pin hole imaging.

Figure 13A:
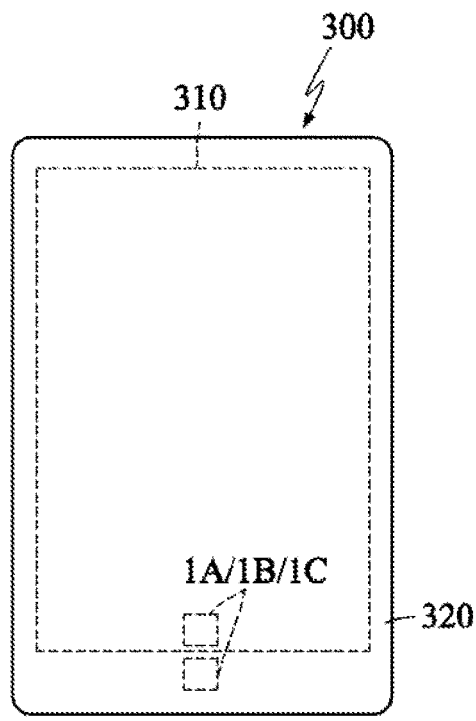
FIG. 13A shows one example of an electronic device according to the preferred application example of the invention.

FIG. 13A shows one example of an electronic device 300 according to the preferred application example of the invention. Referring to FIG. 13A, the electronic device 300, such as a smart phone, including a display 310 and a transparent cover 320 disposed on the display 310. The electronic device 300 may be installed with the integrated sensing module 1A, 1B or 1C, more particularly an under-cover integrated sensing module, and may also be installed with the integrated sensing module 1A, 1B or 1C, which is an under-display integrated sensing module (such installation is applicable to any display position).

Figure 13B:
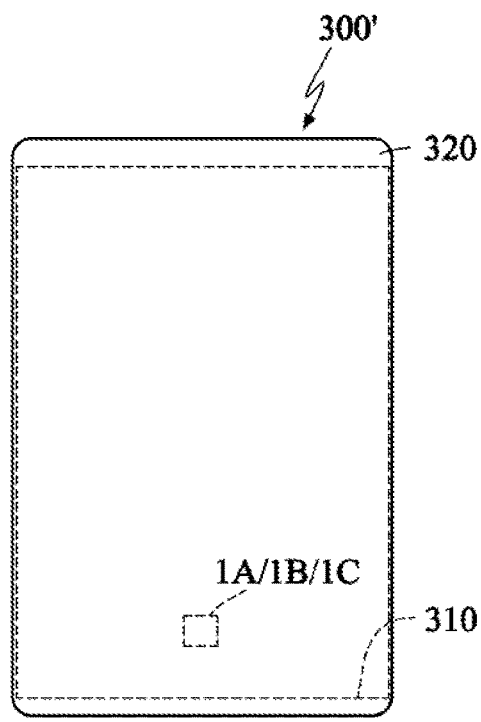
FIG. 13B shows another example of the electronic device according to the preferred application example of the invention.

Of course, the OLED or micro LED display pertains to the prior art, the invention is described only based on the portion of the main structure without re-defining the structure and material thereof, wherein the portions of the display, which are not described in detail, may be referred to the existing art without affecting the creation of the application example of the invention. The most important characteristic of this application example is to make the user to obtain the display content and biometrics recognition ability concurrently at any specified position of the display (any specified position of the display can execute the displaying and biometrics characteristics sensing), and such design is not available in the present market. This is very important to the design of the product, such as the mobile phone and can have a whole new industrial design, the narrow border and the full screen concept. FIG. 13B shows another example of an electronic device 300' according to the preferred application example of the invention. Referring to FIG. 13B, the electronic device 300', such as a smart phone, includes a display 310 and a transparent cover 320 disposed on the display 310. The display 310 is present in a full screen pattern. The electronic device 300' may be installed with the integrated sensing module 1A, 1B or 1C.

Figure 14:
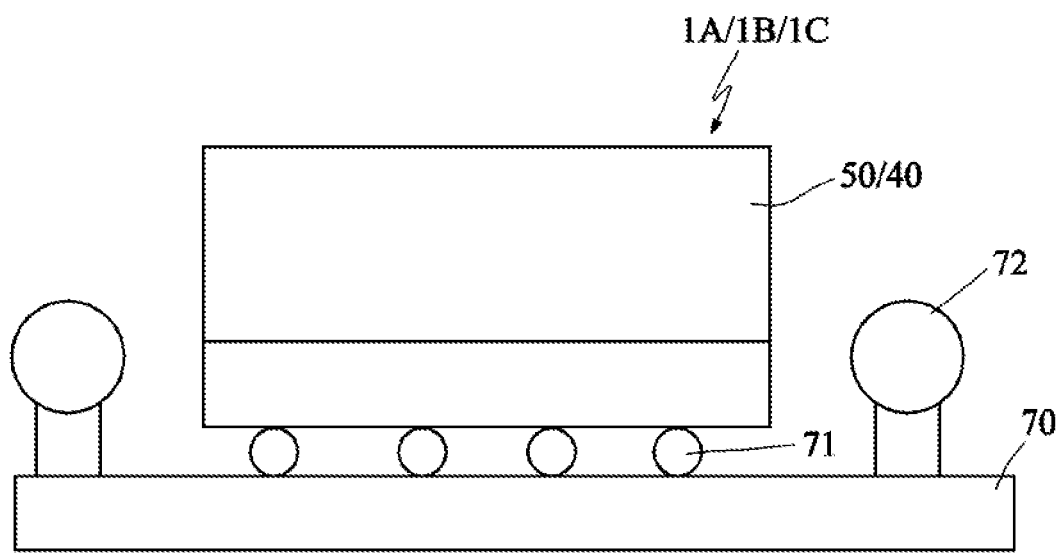
FIGS. 14 and 15 show two applications of the integrated sensing module according to the preferred application example of the invention.
Figure 15:
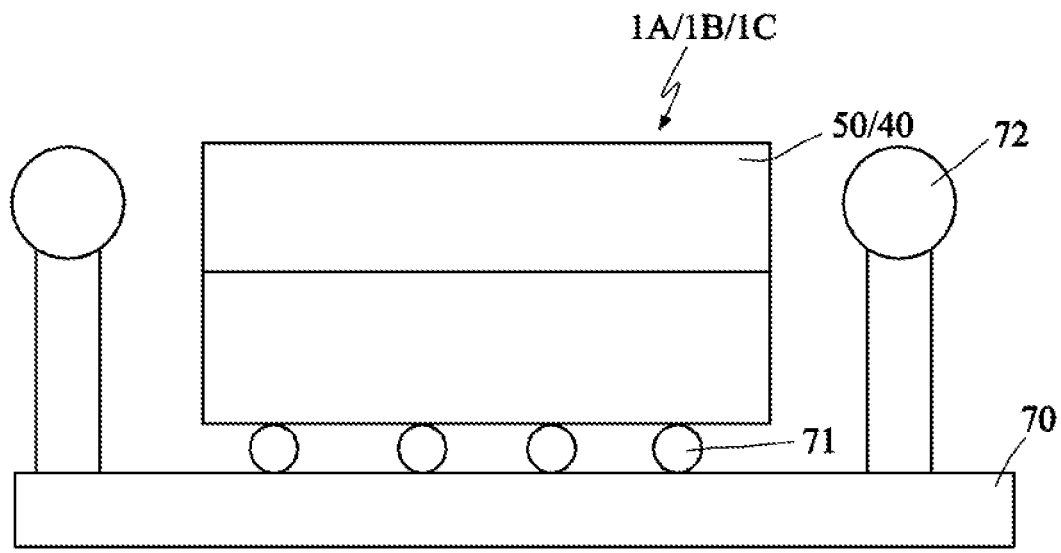

FIGS. 14 and 15 show two applications of the integrated sensing module 1A/1B/1C (referred to as the integrated sensing assembly) according to the preferred application example of the invention. As shown in FIG. 14, the integrated sensing module may have the bonding pads disposed on the backside by way of through silicon via (TSV) or wiring from the lateral side, and then bonded to a circuit board (especially a flexible circuit board) 70 through solder balls 71. A light source 72 is also disposed on the flexible circuit board 70, and the light rays of the light source may be guided to the object through light guide plates (not shown). The architecture of FIG. 15 is similar to that of FIG. 14 except for the difference that the light source 72 is almost horizontally projected into the transparent cover 50, and the light rays are projected onto the object according to the waveguide principle. Thus, the light source may be disposed on one or multiple sides of the transparent cover assembly 40, or may be disposed on the same or different levels (heights), and the light rays may enter the transparent cover assembly 40 from the side surface of the transparent cover assembly 40 and projected onto the object F according to the waveguide principle.

Figure 16:
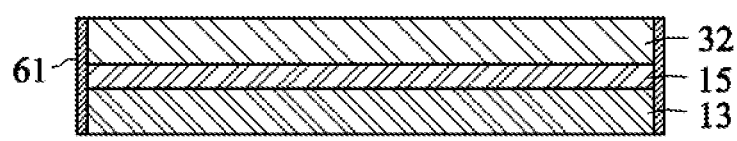
FIG. 16 is a schematic view showing an application of the obstructing glue.

The application example of the invention application example further includes the application of the obstructing glue 61 shown in FIG. 16. As shown in FIG. 16, inter-metal dielectric layer set 13, an obstructing glue 61 is coated onto the periphery of the first protection layer 15 and the transparent substrate 32 to prevent the light rays from being outputted or entering to cause the interference, so that a perfect darkroom can be formed.

Therefore, the single micro hole can be used to perform the optical image sensing, and the integrated sensing module may be further integrated with a display easily to achieve the display, touch and fine biometrics characteristics sensing effects.

Figure 17:
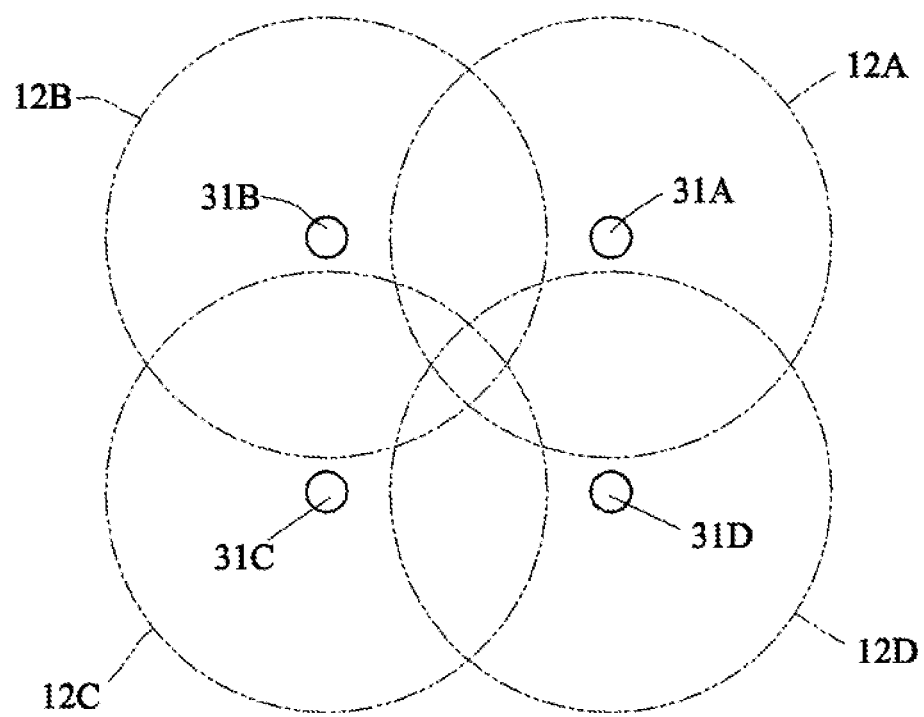
FIG. 17 shows an application of an integrated sensing module having multiple micro holes according to a fifth application example of the invention.

FIG. 17 shows an application of an integrated sensing module having multiple micro holes according to the fifth application example of the invention. In this non-restrictive application example, four micro holes 31A to 31D are present, and correspond to four overlapping sensing ranges 12A to 12D of four sensing unit arrays. This can enlarge the sensing surface area of the integrated sensing module, and is further applicable to the under-display application of FIG. 13B. For example, if the original single micro hole corresponds to the sensing surface area of 5 mm*5 mm, then the sensing surface area can be enlarged into 10 mm*10 mm when four micro holes are adopted, and the area of the whole finger can be sensed at a time. In addition, the total light amount of all the micro holes is increased to obtain the better sensing result, wherein the false acceptance rate (FAR) and false rejection rate (FRR) thereof are further improved, and the alignment state between the finger and the integrated sensing module also needs not to be very stringent. The sensing results obtained by the sensing ranges 12A to 12D may be processed independently, or may be stitched into a large sensed image by way of union. It is worth noting that although four micro holes are described as an example, another number of micro holes may also be used to implement the invention.

Figure 18:
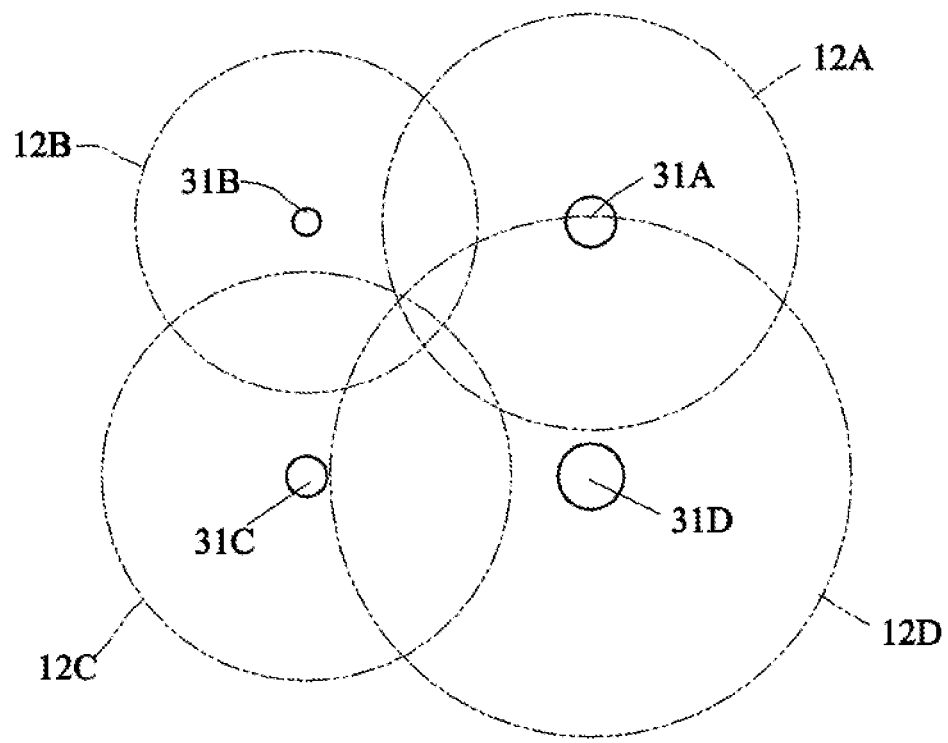
FIG. 18 shows an application of an integrated sensing module having multiple micro holes according to the fifth application example of the invention.

The sensing ranges 12A to 12D of FIG. 17 have the same dimension. However, the invention is not restricted thereto. FIG. 18 shows an application of an integrated sensing module having multiple micro holes according to the fifth application example of the invention. In the non-restrictive application example similar to FIG. 17, four micro holes 31A to 31D have different dimensions, and four overlapped sensing ranges 12A to 12D corresponding to four sensing unit arrays also have different dimensions. Different wavelengths of light sources pass through different micro holes, so that different depths of images can be sensed. For example, the skin layer, the dermal layer and the finger vein image of the same finger are sensed at the same time, so that multiple biometrics characteristics can be obtained at a time. In addition, the finger may also be moved over the sensing region in the up, down, left and right directions, so that the image-stitching effect of multiple partial biometrics characteristics may be obtained. The above-mentioned application examples may be applied to the following optical imaging system with a variable light field for a biometrics application.

Any optical sensor usually has a dynamic range of optical sensing, under the too-low illumination (e.g., darkness), the sensed optical signal is too weak. In the day, the glare makes the sensed optical signal saturate. If such the photosensor (usually a photosensor array element) functions as a biometrics recognition sensor, for sensing fingerprint, vein, blood oxygen concentration, heartbeat or the like (more particularly a fingerprint sensor is used), a light source (combined with the sensor to become a sensing system) is usually needed to project the light rays onto the surface of the finger, wherein the photosensor senses the light rays reflected by the surface of the finger and the light intensity distribution corresponding to the fingerprint image is obtained.

The light source adopted in the conventional optical sensing system provides the light rays with the constant light field (the light source is usually disposed around the photosensor) and the fixed or constant intensity, color (wavelength) and distribution. When the background light is very strong (in the sun, for example), the saturation state of the signal can be easily reached, or partial array elements close to the light source sense the stronger reflected light, while partial array elements away from the light source sense the weaker reflected light, the intensity distribution of the sensed image is very nonuniform. This would affect the image quality and subsequent processing.

The integrated sensing modules of the above-mentioned application examples may be applied to the optical imaging system with the variable light field for the biometrics application according to the invention so that at least one embodiment that can be implemented is provided. However, the optical imaging system of the invention is not limited to only the applications of the above-mentioned integrated sensing modules. The spirit of the invention is directed to an electronic apparatus, such as the smart phone, tablet computer, notebook computer, intelligent watch or the like, having a display, so that an optical imaging system with a variable light field for a biometrics application is provided. The smart phone working in conjunction with the optical fingerprint sensor will be described as a non-limitative example.

The smart phone is continuously developed toward a buttonless and full-screen trend. If the optical fingerprint sensor is to be disposed in the front side of the smart phone (that is, the display surface), then two optical sensor designs may be adopted. The first design is an in display (referred to as ID) design, and the second design is an under display (referred to as UD) design. The optical fingerprint sensors for the two designs may be disposed in a specific partial region or the unspecified full region of the display.

In the ID design, the optical sensor may be integrated into the process of the display panel. For example, the photo diode is formed using the thin film transistor (TFT) material, the associated technology with the display device including the optical sensor has been presented in the industry, wherein detailed descriptions thereof will be omitted. Another ID design relates to a micro LED display, wherein micro LED dies are assembled onto a display substrate (e.g., glass substrate, flexible organic substrate, silicon substrate or the like). Similarly concepts may also be adopted to assemble the photosensor dies between the micro LED dies. Such the design may also be regarded as an ID structure.

The UD design has not been mentioned before. Please refer to U.S. Patent application Ser. Nos. 62/420,041 and 62/384,381 of this inventor, each of which provides an independent optical sensor disposed under the display panel. The above-mentioned application examples have provided a solution of implementing the UD design, wherein detailed descriptions thereof will be omitted.

In the following optical imaging system of the invention, the key point does not completely reside in the sensor design because either the ID or UD deign may be applied to the sensor of the system design of the invention. The above-mentioned design of the variable light field can be used so that the photosensor senses the more uniform geometric distribution of luminance, so that the image quality of the fingerprint becomes better and this is more advantageous to the recognition and comparison.

Figure 19:
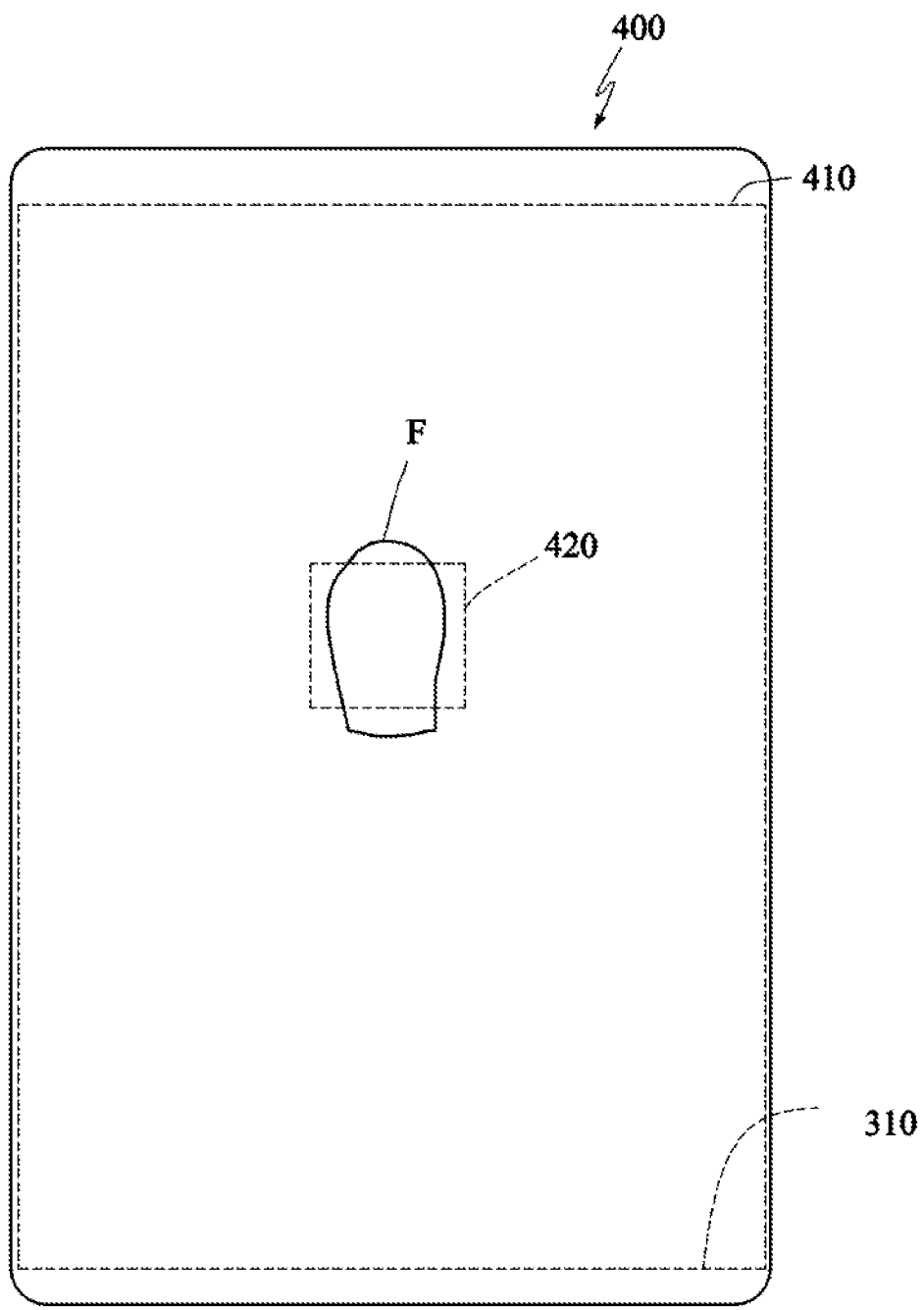
FIG. 19 is a schematic view showing an optical imaging system with a variable light field for a biometrics application according to a first embodiment of the present invention.

FIG. 19 is a schematic view showing an optical imaging system 400 with a variable light field for a biometrics application according to a first embodiment of the present invention. Referring to FIG. 19, the optical imaging system 400 has, for example, a buttonless and full-screen (or narrow border) design (of course, the concept of the invention is also applicable to terminal products including a button and any one of various screens), and has a display 410 and an optical imaging device (or sensor) 420. The effective sensing surface area of the optical imaging device 420 is represented by dashed lines (however, the invention is not restricted thereto because the size and shape of the effective sensing surface area may be adjusted according to the design). When the finger F is placed on, above or over the display 410 and corresponds to the optical imaging device 420, the optical imaging device 420 may sense the optical biometrics characteristics of the finger F to obtain an image sensing signal. Herein, the optical imaging device may be of the ID or UD type.

The most important spirit of the variable light field of the invention resides in that when the ID/UD optical imaging device is disposed at a specific or whole positions of the screen, it may function as a biometrics signal sensor for sensing, for example, fingerprint, vein, blood oxygen concentration, heartbeat or the like. Herein, the fingerprint sensor will be described as an example. Different from prior art which needs an additional light source for providing a constant light field, the invention utilizes the screen as the projecting light source for the ID/UD photosensor, the advantage is that the cost can be saved (additional light source and light source control integrated circuit (1C) are not needed). The more important inventive spirit is to utilize the feature that the screen provides a digital light signal (that is, the screen provides a light source composed of an array of light spots). The digital light signal may be configured to have a variable light field by the software/firmware and the active control of the system. This design concept has not been mentioned before, and the advantage and control method thereof will be described in the following.

Figure 20:
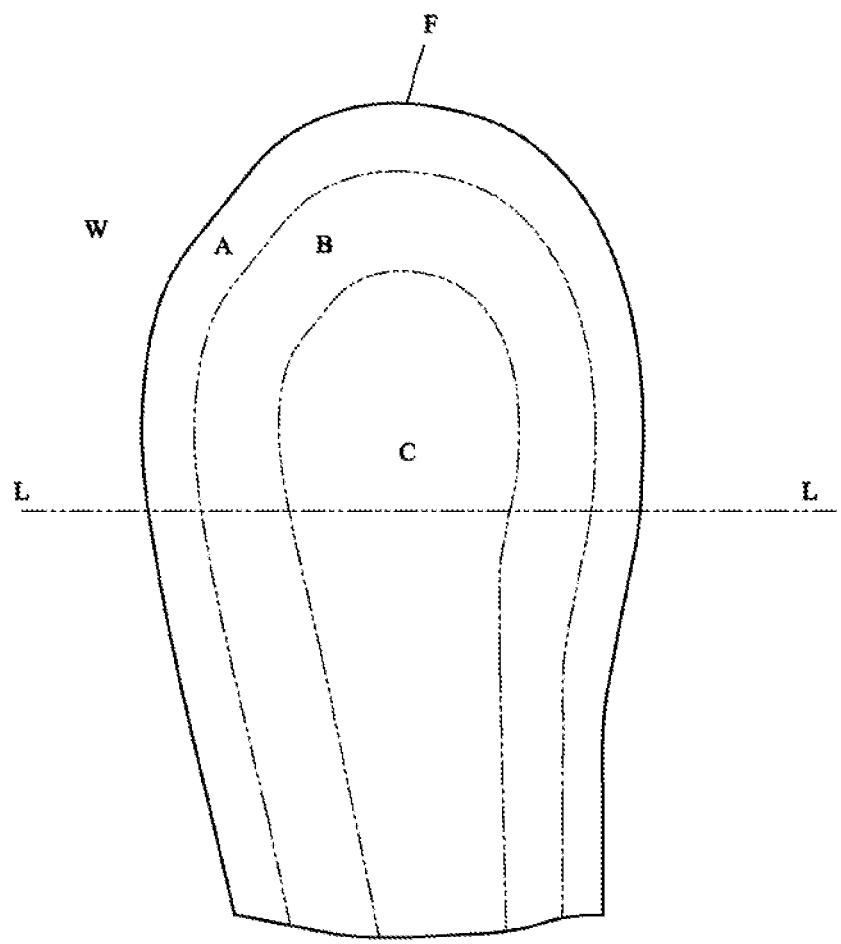
FIG. 20 is an enlarged partial view showing the optical imaging system.

FIG. 20 is an enlarged partial view showing the optical imaging system 400. As shown in FIG. 20, the display can be conceptually divided into four regions A, B, C and W. The region W is not covered by the finger F, and all the environment light rays may illuminate the region W; the region A represents an outer region covered by the finger F, and most of the environment light rays still can enter the region A from the lateral side; the region B represents a middle region covered by the finger F, and the partial environment light rays descending from outside to inside still can enter the region B from the lateral side; and the region C represents an inner region covered by the finger F, and almost no environment light ray can enter the region C from the lateral side. Herein, the regions are represented according to the shape of the profile of the finger F schematically, and the division of the regions is made only for the purpose of conveniently explaining the advantage of the invention, and does not provide the physical restriction or absolute meanings. In addition, most of the region W does not relate to the operation of the optical imaging device 420 (the optical imaging device 420 may be designed to cover the larger range to respond with different sizes of fingers or various used conditions). For example, when the optical imaging device 420 operates in the sun and the display 410 provides no light source ad the region W is not considered, the brightness of the sensed image of the optical imaging device 420 decreases from region A to region B and then from region B to region C. The optical imaging device 420 receives the digital light signal reflected by the finger F to obtain optical biometrics characteristics of the finger F. The combination of regions A, B and C is referred to as a cover region of the display 410 covered by the finger F and have the variable light fields varying from region A to the middle region B and the inner region C. Of course, the middle region B needs not to be present, and depends on the division standard of the illumination or brightness. When the middle region B is absent, the variable light fields gradually vary from region A to the inner region C. In addition, the finger F may also be replaced with an object, such as an organism (palm or the like).

Figure 21A:
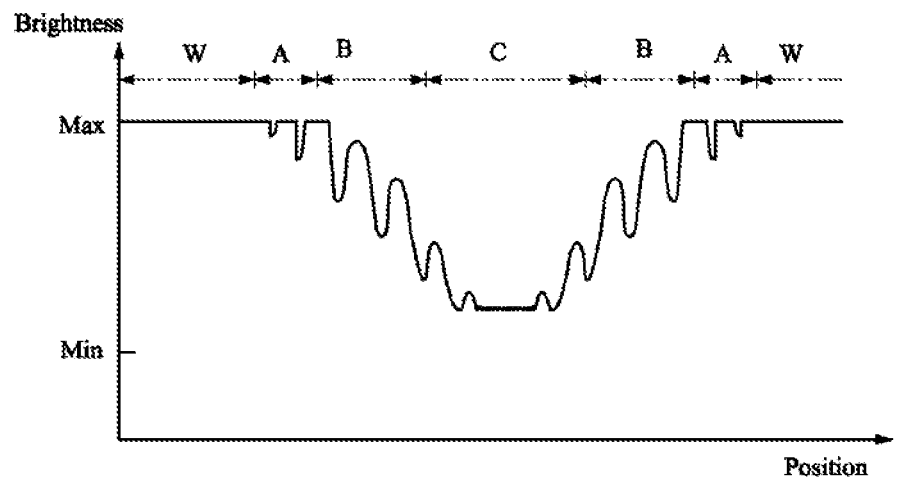
FIG. 21A is a schematic view showing the optical signal intensity sensed in each region taken along a line L-L of FIG. 20.
Figure 21B:
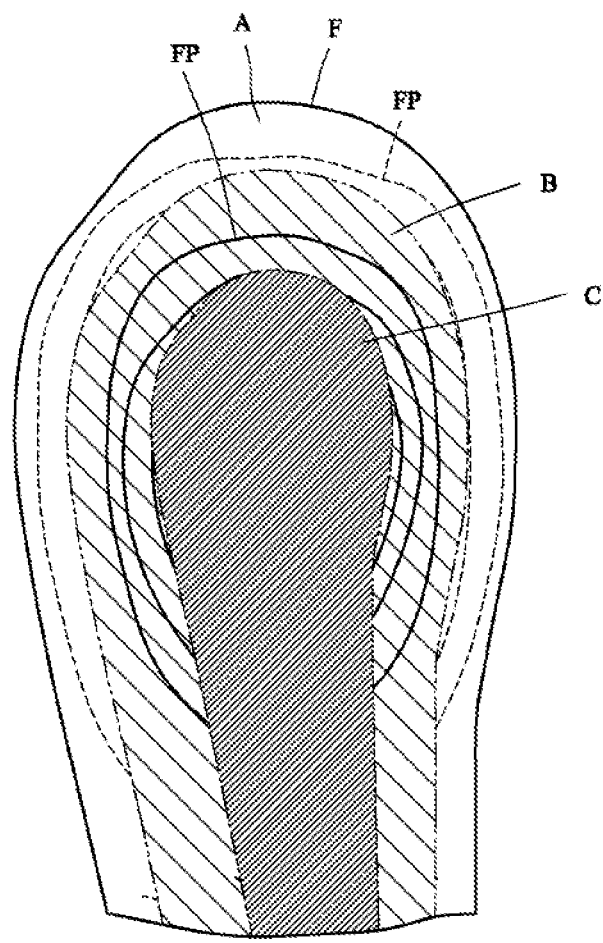
FIG. 21B is a schematic view showing the sensed fingerprint image corresponding to FIG. 21A.

FIG. 21A is a schematic view showing the optical signal intensity sensed in each region taken along a line L-L of FIG. 20. It is worth noting that this figure is made to present the relative illustration but not the absolute measurement result. As shown in FIG. 21A, most of the sensing signals of the partial array elements in the region A approach the saturation value or maximum (Max) (due to the sunlight intensity), most of the sensing signals of the partial array elements in the region C approach the minimum (Min) (because the approaching to the darkness), while the sensing signals of the partial array elements in the region B range between Max and Min and descends from outside to inside. Thus, the sensed fingerprint image is shown in FIG. 21B, wherein the ridge and valley of the fingerprint FP in the region A are unclear (due to the signal saturation, and represented by dashed lines), the ridge and valley of the fingerprint FP in the region B can be distinguished (represented by solid lines) but gradually become dark from outside to inside, and the ridge and valley of the fingerprint in the region C cannot be distinguished again because the overall region is dark (due to the darkness and no signal is obtained). In this case, the area where the clear fingerprint image can be sensed (the intensity contrast is present between the ridge and valley) is very small, and the subsequent recognition and comparison cannot be performed.

Figure 22A:
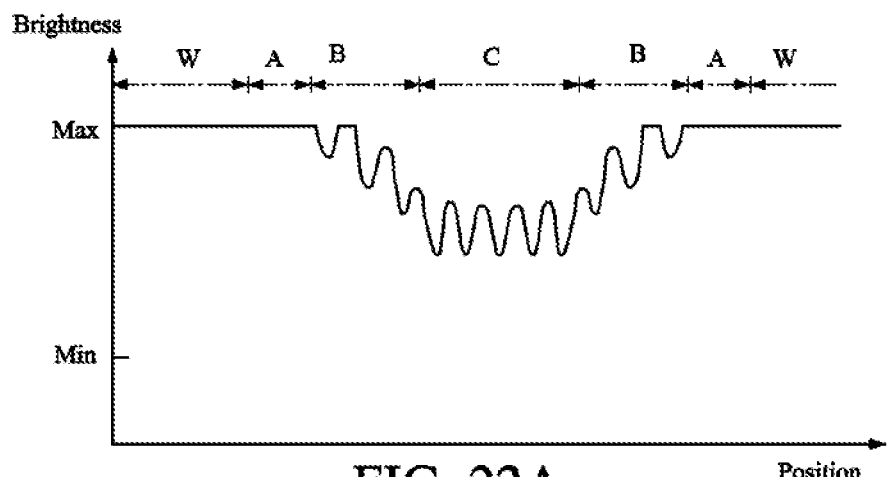
FIG. 22A shows another example of the sensing result taking along the lines L-L of FIG. 20.
Figure 22B:
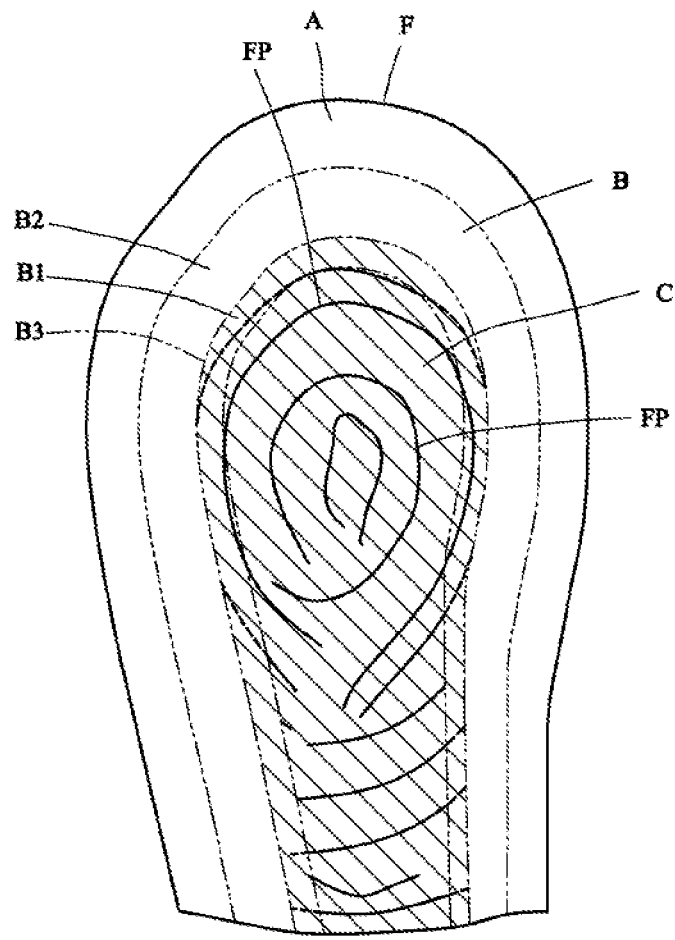
FIG. 22B is a schematic view showing the sensed fingerprint image corresponding to FIG. 22A.

FIG. 22A shows another example of the sensing result taking along the lines L-L of FIG. 20. As shown in FIG. 22A, if the light source outputted from the display functions as the light source with a constant light field to provide light rays to the finger F in a manner similar to the prior art, the fingerprint image in the original too-dark region C can be identified. However, the regions A and B have the light rays of the display and the environment light rays, so that more brightness values sensed in more areas approach the saturation value. Thus, the sensed fingerprint image is shown in FIG. 22B, wherein the whole region A has the signal saturation (represented by white, so the ridge and valley cannot be distinguished), the fingerprint signal in the outer region B2 of the region B becomes saturated (the outer region B2 is partitioned from the inner region B1 by the partitioning line B3), the ridge and valley in the inner region B1 still can be distinguished while the fingerprint image in the region C becomes clear. In this case, the area where the clear fingerprint image can be sensed (the intensity contrast is present between the ridge and valley) is still very small. This is also disadvantageous to the subsequent recognition and comparison.

Figure 23A:
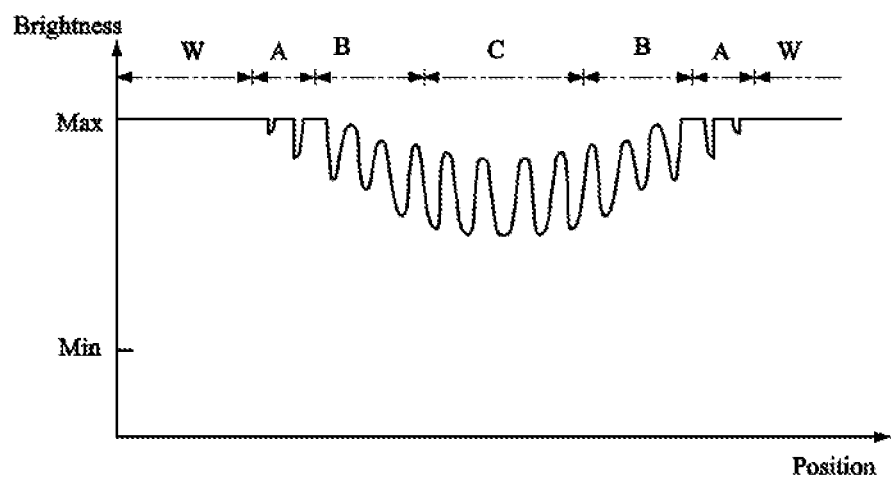
FIG. 23A shows still another example of the sensing result taking along the lines L-L of FIG. 20.
Figure 23B:
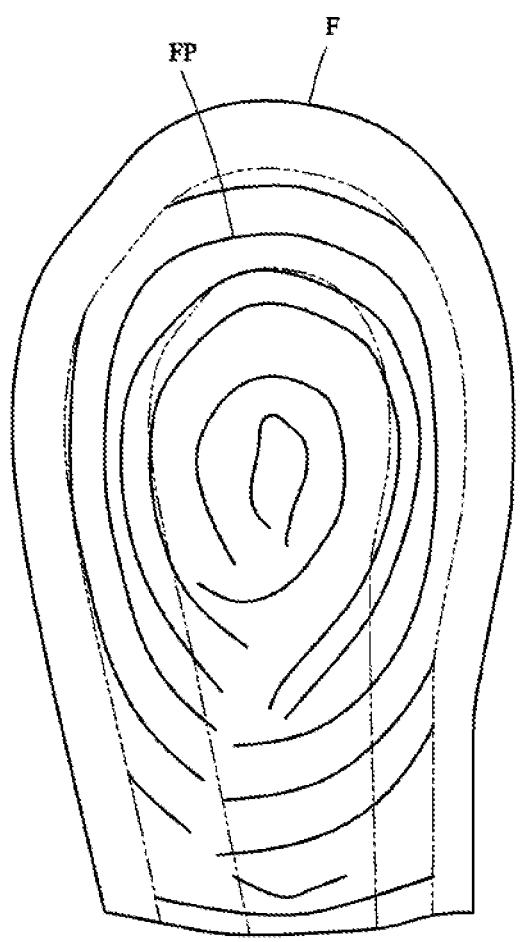
FIG. 23B is a schematic view showing the sensed fingerprint image corresponding to FIG. 23A.
Figure 23C:
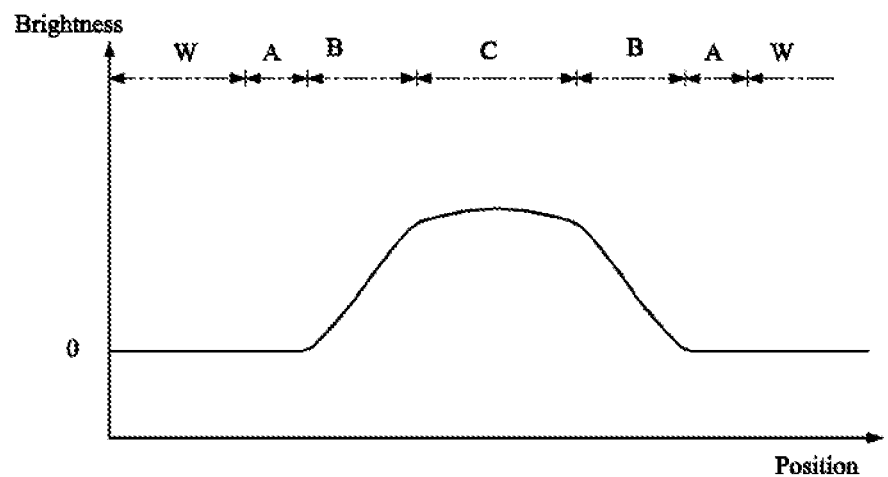
FIG. 23C is a schematic view showing the variable light field provided by this embodiment.
Figure 23D:
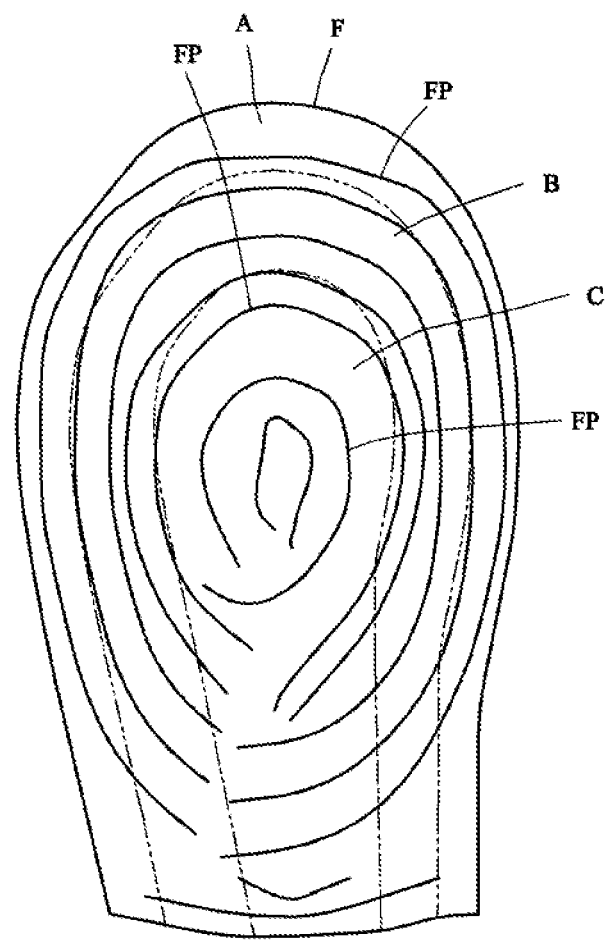
FIG. 23D is a schematic view showing the sensed fingerprint image corresponding to FIG. 23C.
Figure 23E:
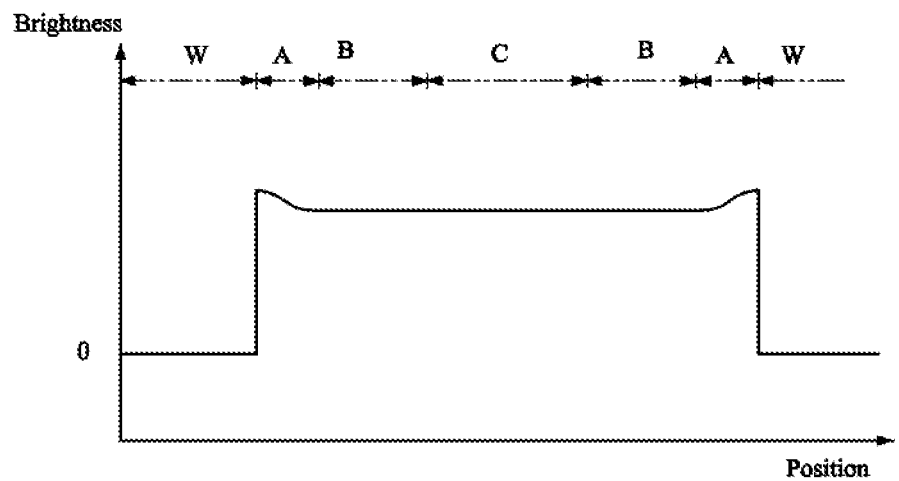
FIG. 23E is a schematic view showing the variable light field corresponding to FIG. 23D.

FIG. 23A shows still another example of the sensing result taking along the lines L-L of FIG. 20. The invention changes the constant light field into the variable light field through the light source of the invention for providing the variable light field and through the array of point light sources independently corresponding to each of the pixels. No brightness is provided in region A, the brightness provided in the region B is slightly and gradually increased from outside to inside, and the brightness provided in the region C is highest to compensate with the environment light rays, so that the brightness in the regions B and C possibly reaches the uniform state and the optical imaging device 420 obtains the better sensing result. The sensed fingerprint image is shown in FIG. 23B, wherein the ridges and valleys in most of the regions can be clearly distinguished, and this provide a great help to the subsequent recognition and comparison. FIG. 23C is a schematic view showing the variable light field provided by this embodiment. As shown in FIG. 23C, in the region W to region C from outside to inside, the brightness of the projection light rays provided by the digital light signal of the screen is getting higher and higher (the brightness in region A should be almost the same as that in the region W and approaches 0, the brightness is gradually increased from region B to region C, while the region C has almost the constant brightness). The brightness variation gradients in various regions may be different, so that the effect of this embodiment can be achieved, and the optical imaging device 420 senses the fingerprint image of FIG. 23B. It is worth noting that for the clear illustrative purpose, all the regions in the brightness distribution charts are not drawn according to the scale. In addition, when no environment light source is present or the environment light source is not strong, the more uniform light field in the regions A to C can be provided according to the invention (similar to the constant light field), so that the sensing brightness in the regions A to C cannot get saturated, and the uniform image where the ridges and valleys can be clearly identified can be obtained, wherein the clear fingerprint images are present in the regions A to C, as shown in FIG. 23D. FIG. 23E is a schematic view showing the variable light field corresponding to FIG. 23D. As shown in FIG. 23E, because the environment light source is dark, the more uniform light field is provided, wherein the region A has the higher brightness, and the regions B and C have almost the same and constant brightness.

The above-mentioned variable light field is achieved according to the current display having the independent light-emitting arrays, and effectively utilize the function of the current display to achieve the light compensation effect. Upon application, however, the environment background light needs to be monitored at any time to provide the modulation basis for the variable light field at any time. Thus, the monitoring of the environment light field is also an important inventive spirit of the optical imaging system of the invention.

Figure 24:
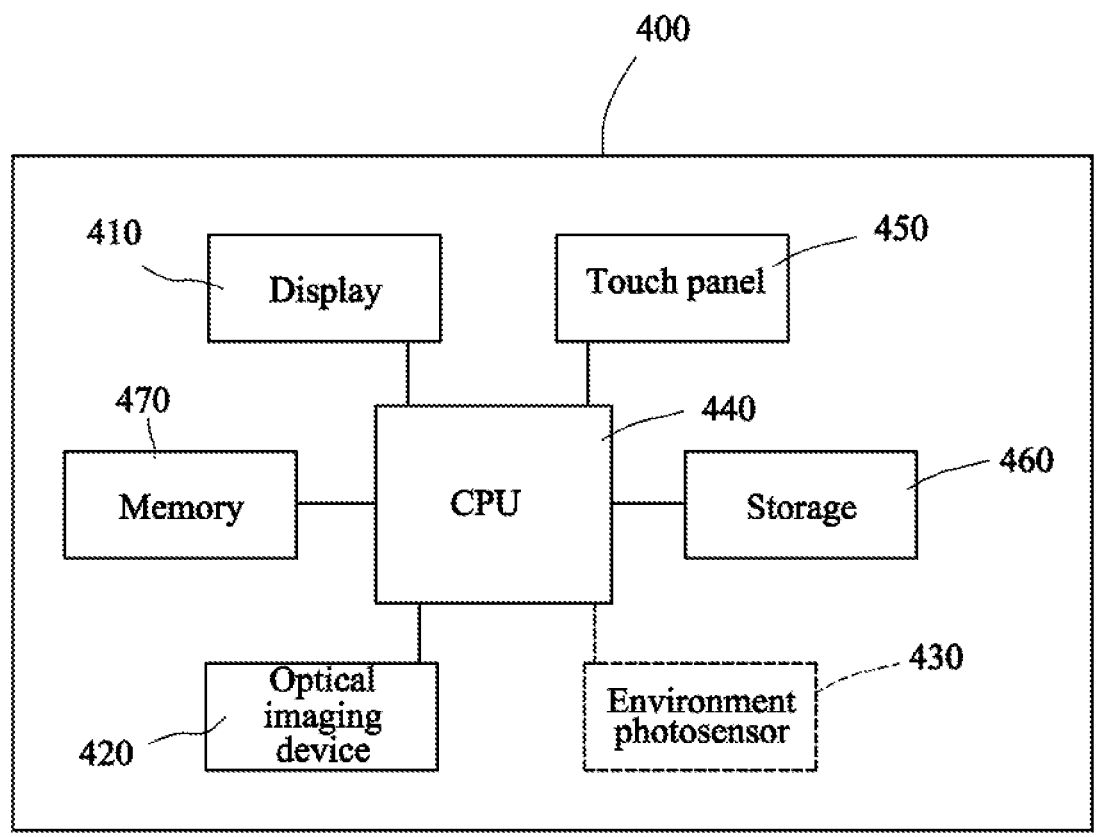
FIG. 24 is a schematic block diagram showing an optical imaging system according to the first embodiment of the present invention.

FIG. 24 is a schematic block diagram showing an optical imaging system according to the first embodiment of the present invention. The optical imaging system may be regarded as an electronic apparatus including the display 410, the optical imaging device 420 and an environment photosensor 430 (it is worth noting that the environment photosensor 430 is represented by dashed lines because the environment photosensor 430 can be omitted when the ID/UD is used for sensing), all of which are electrically connected to a central processing unit (CPU) 440. In addition, the optical imaging system may further include a touch panel 450, a storage 460 and a memory 470, all of which are electrically connected to the CPU 440. The touch panel 450 may provide a touch function, the storage 460 stores data or a database, and the memory 470 functions as a buffer upon calculation. The optical imaging device 420 may be one portion or the whole of the integrated sensing module.

Figure 25A:
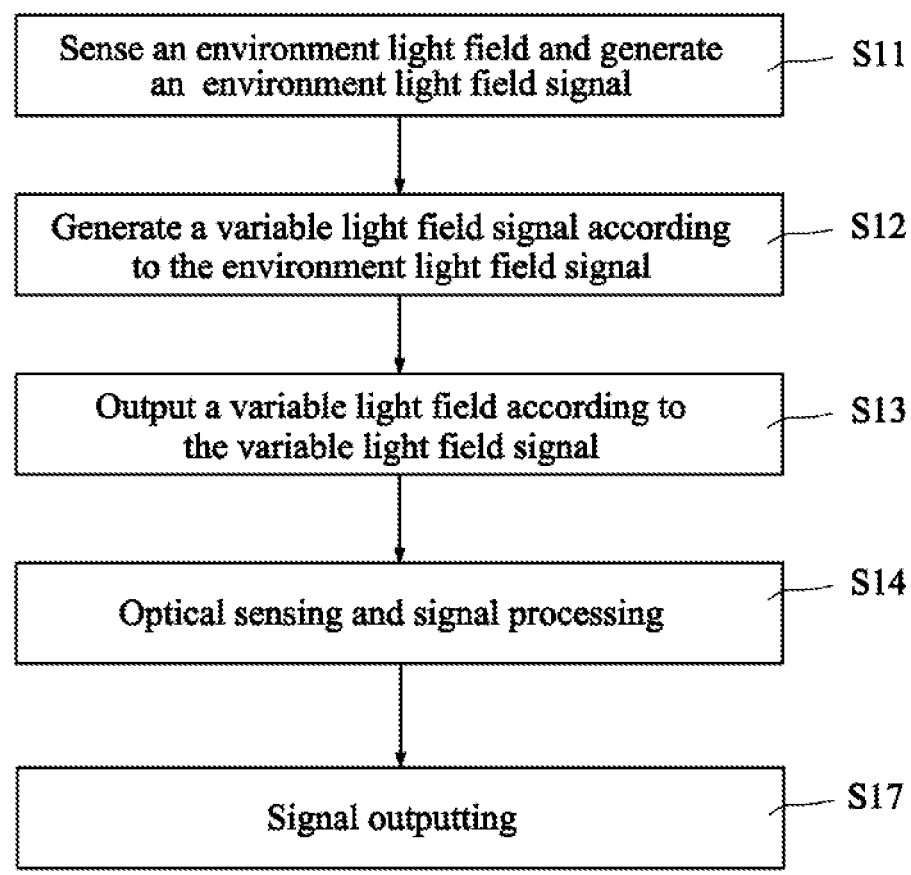
FIGS. 25A and 25B are flow charts showing the operation methods of two examples according to the first embodiment of the present invention.
Figure 25B:
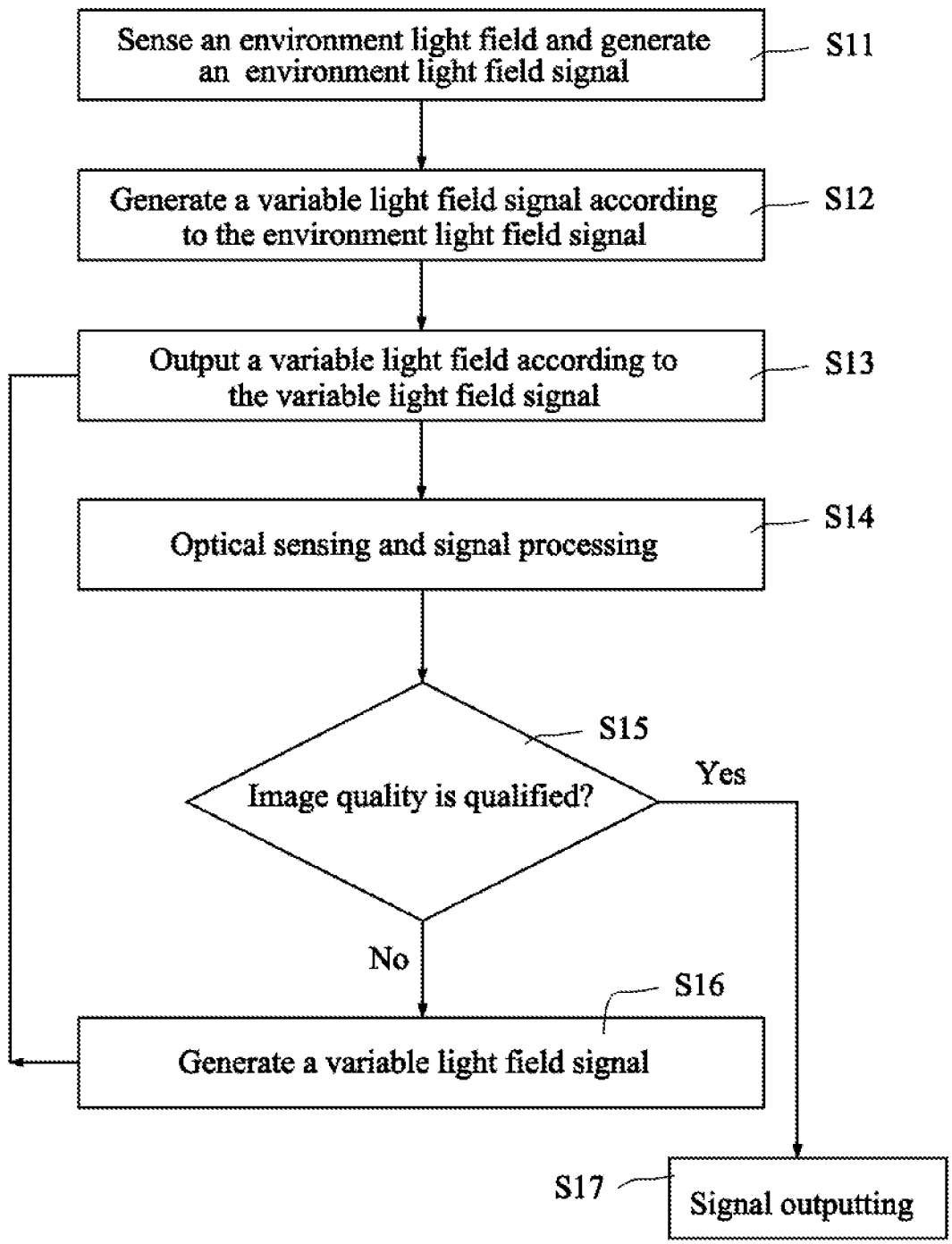

FIGS. 25A and 25B are flow charts showing the operation methods of two examples according to the first embodiment of the present invention. As shown in FIGS. 25A and 24, the environment photosensor (ambient light sensor) 430 senses the condition of the environment light field in the environment where the electronic apparatus is located (including, for example but without limitation to, the intensity, color and distribution) and generates an environment light field signal (step S11), and transmits the environment light field signal to the CPU 440. The CPU 440 generates a variable light field signal according to the environment light field signal (step S12), and controls the display 410 to output a variable light field, for illuminating the finger, according to the variable light field signal (step S13). The environment photosensor 430 may be an independent photosensor, or the ID/UD optical imaging device of the invention functions as the environment photosensor. The display 410 provides the variable light field, and further displays information to the user or interact with the user, and provides the function similar to that of the display of the general mobile phone, including, for example but without limitation to, guiding the user to place the finger in a sensing region of the optical imaging device 420. In one example, the variable light field can be complementary to the environment light field, to illuminate the finger, so that a uniform optical image is obtained. This is because the finger F obstructs the environment light field when the finger touches or approaches the display 410, but the environment light field enter the region under the finger from the periphery of the finger to provide the finger with a little illumination, which is not sufficient to make the optical imaging device 420 generate the good sensing result. Thus, the display 410 provides the light rays with the variable light field to illuminate the finger, so that the environment light field plus the variable light field can provide the uniform light field to the finger (for example, the CPU 440 can calculate the information of the variable light fields in regions B and C of FIG. 20 and control the display 410 to emit light, to generate the light field with the gradient light rays and the rectangular shape, circular shape, elliptic shape or any other shape). The optical imaging device 420 senses the fingerprint image and performs the signal processing in the condition where the environment light field and the variable light field are present (the CPU 440 or optical imaging device 420 may perform the processing) and the desired signal is generated, such as the signal corresponding to the vein pattern, fingerprint, blood oxygen concentration, heartbeat data or the like (step S14). Next, the CPU 440 directly processes the image sensing signal and then performs the fingerprint enrolling and comparing operations (or in another example, vein image processing, blood oxygen concentration outputting and heartbeat data outputting), so that the image sensing signal is outputted (step S17).

The example of FIG. 25B is similar to FIG. 25A except for the difference that in the first mode, the CPU 440 directly processes the image sensing signal and then performs the fingerprint enrolling and comparing operations, so that the image sensing signal is outputted (step S17, the judgement of step S15 is not performed), while in the second mode, the CPU 440 judges whether the image sensing signal falls within the acceptable range (step S15, judging whether the sensed image quality is qualified or useful). If yes, then the image sensing signal is outputted (step S17); and if not, then the variable light field signal is generated according to the judged result (step S16) to feedback control the display 410 to change its variable light field (step S13), while the user is indicated or guided, through the display 410 or speaker (not shown), to have the fingerprint of the finger be sensed. In a third mode, after receiving the partial image sensing signal of the optical imaging device 420, the CPU 440 immediately feedback controls the display 410 to change its variable light field, and controls the optical imaging device 420 to generate the image sensing signal again.

Figure 26:
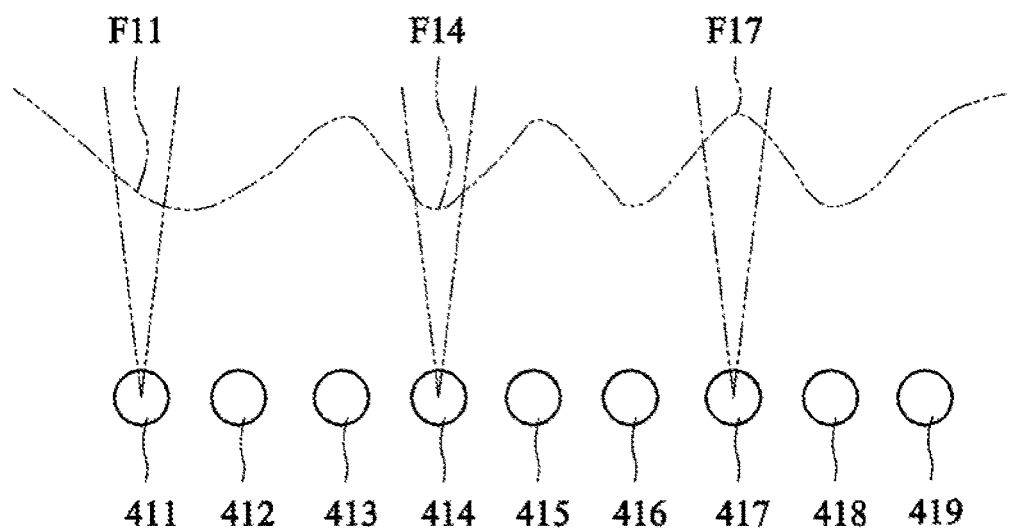
FIG. 26 is a schematic view showing the provision of the variable light field according to the second embodiment of the invention.

FIG. 26 is a schematic view showing the provision of the variable light field according to the second embodiment of the invention. As shown in FIG. 26, the variable light field provided by the display 410 pertains to a structured light projection mode. For example, the specific graphic light field illuminates each region of FIG. 20, wherein the light-emitting operation of the display 410 is synchronous with the image capturing operation of the optical imaging device 420. For example, the display 410 includes multiple light emitting units 411 to 419, such as LEDs, wherein each light emitting unit can output red, green and blue lights. In one example, at a first time point, the light emitting units 411, 414 and 417 output first light rays or patterns (of course, different light intensities may be used), so that the optical imaging device 420 senses a first image; at a second time point, the light emitting units 412, 415 and 418 output second light rays or patterns, so that the optical imaging device 420 senses a second image; and at a third time point, the light emitting units 413, 416 419 output third light rays or patterns, so that the optical imaging device 420 senses a third image. Because each point light source has a divergence angle, when it projects light out of a predetermined distance, the light diverges into a fixed-shape of area (e.g., a circular area). If the projection surface is on a 3D object (e.g., 3D fingerprint), then the fixed shape of area also deforms. Thus, using one set of projection light sources (one set of arbitrary shapes of light areas on the 3D projection surface), the optical imaging device can sense the set of different shapes of light areas to calculate the 3D information. The divergence angles of the light emitting units are shown in the drawing. When the light emitting unit 411 illuminates the portion F11 of the finger (a moderate distance from the light emitting unit), the sensed image of the optical imaging device 420 has the moderate area; when the light emitting unit 414 illuminates the portion F14 of the finger (the shortest distance to the light emitting unit), the sensed image of the optical imaging device 420 has the minimum area; and when the light emitting unit 417 illuminates the portion F17 of the finger (the longest distance to the distance light emitting unit), the sensed image of the optical imaging device 420 has the maximum area. Thus, the CPU 440 calculates the state (e.g., the deformation state), the area size and intensity distribution of each light spot (or pixel point) of the first to third images, and superimposes the first to third images to obtain a three-dimensional fingerprint (or biometrics characteristic) image, which is different from the conventional two-dimensional image, so that more judgement bases for the biometrics characteristics can be provided. This can further avoid the counterfeiting cracking system using the two-dimensional image. Heretofore, the variable light field of the invention provides not only the brightness modulated light field for obtaining the image quality with the optimum uniformity, but also a projection method using the structured light to analyze the 3D structure of the to-be-measured object. The implementation of the structured light is not restricted to the descriptions of the embodiments, and any geometric light projection and image sensing and processing method is deemed as failing within the scope of the invention as long as the optical imaging system of the invention is utilized.

In another example of the variable light field, the CPU may control the light emitting units to output different colors of light rays to detect the color of the skin of the sensed finger, so that it is possible to further judge whether the object is a counterfeit finger. Because the finger skin has different absorptivities for different wavelengths of lights (the absorptivity for the short wavelength is high, and the absorptivity for the long wavelength is low), so the variable light field of the invention may also work in conjunction with the selection of the wavelength to sense the under-skin characteristics, such as the dermal layer, finger vein, blood oxygen concentration, heartbeat or the like. Because the light emitting units of the display of the invention can be independently control to emit light or not, the three-dimensional image sensing using the structured light can be achieved. These are the advantages that cannot be achieved by the prior art.

Figure 27:
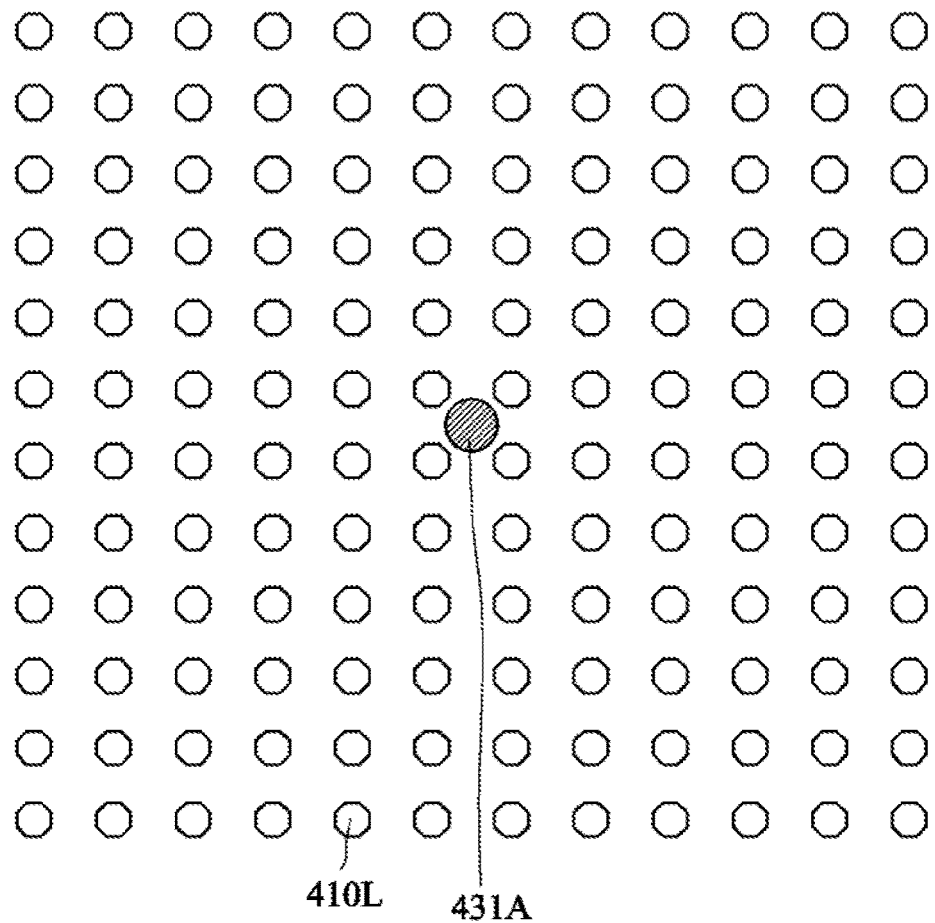
FIG. 27 is a partial enlarged schematic view showing the optical imaging system according to the second embodiment of the invention.

FIG. 27 is a partial enlarged schematic view showing the optical imaging system according to the second embodiment of the invention, this pertains to an embodiment where UD is adopted. As shown in FIG. 27, the light emitting units 410L of the display are arranged in an array, and are independently controlled to emit light, so that they can be controlled to emit light independently or in a partitioned manner. The above-mentioned micro hole 431A is disposed in the gap between the light emitting units 410L, so that the above-mentioned micro-hole imaging principle is achieve to perform the fingerprint sensing. It is worth noting that multiple micro holes 431A may also be provided to achieve the micro-hole imaging effect. In addition, the above-mentioned structured light may also be incorporated with the light ray compensation function of the variable light field to compensate the structured light.

The variable light field can be provided by executing the specific software installed in the electronic apparatus (e.g., built in the operation system of the electronic apparatus). This specific software can execute the procedures of FIG. 25A or 25B to control the array light source of the display to display the desired light field (e.g., displaying the specific graphic pattern). This is no problem in the current display control, so detailed descriptions thereof will be omitted.

With the above-mentioned embodiment, it is possible to provide an optical imaging system with a variable light field for a biometrics application, which is integrated with the display of the electronic apparatus. Thus, various light fields outputted from the light emitting units of the display can be used (to provide the light field with the gradually increasing brightness in the region covered by the finger from outside to inside through the array of point light sources independently corresponding to each of the pixels) or the structured light can be used (to output different light fields of light sources at different time points) to achieve the biometrics characteristic sensing, and achieve the displaying, touch and biometrics sensing effects concurrently.

While the invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. An optical imaging system with a variable light field for a biometrics application, the optical imaging system comprising:
    a central processing unit (CPU);
    a display, which is electrically connected to the CPU, displays information to a user or interacts with the user, and provides a digital light signal to a finger placed upon and in contact with the display, wherein the finger covers a cover region of the display, and the cover region has at least one outer region and an inner region from outside to inside; and
    an optical imaging device, which is electrically connected to the CPU and disposed in or under the display, wherein the optical imaging device receives the digital light signal provided from the display to the finger and then reflected from the finger, and obtains an optical image of biometrics characteristics of the finger to obtain an image sensing signal, wherein the digital light signal provided from the display to the finger has the variable light field varying from the outer region of the cover region of the display to the inner region of the cover region of the display to compensate with environment light rays so that an environment light field plus the variable light field provides an improved light field to the finger, brightness in the outer region and the inner region of the display reaches an improved state and the optical imaging device obtains an improved sensing result.

2. The optical imaging system according to claim 1, wherein:
    the optical imaging system further comprises an environment photosensor electrically connected to the CPU; or the optical imaging device further functions as the environment photosensor; and
    the environment photosensor senses the environment light field, generates an environment light field signal and transmits the environment light field signal to the CPU, so that the CPU generates a variable light field signal according to the environment light field signal, and controls the display to output the variable light field to illuminate the finger according to the variable light field signal.

3. The optical imaging system according to claim 2, wherein the variable light field is complementary to the environment light field to illuminate the finger, so that the uniform optical image is obtained.

4. The optical imaging system according to claim 2, wherein the CPU judges whether an image quality of the optical image is qualified or useful, outputs the corresponding image sensing signal if the image quality is qualified or useful, and generates the variable light field signal according to a judged result to feedback control the display to change the variable light field, and indicate the user to sense the finger again if the image quality is not qualified or not useful.

5. The optical imaging system according to claim 2, wherein the CPU immediately feedback controls the display to change the variable light field after receiving a partial image sensing signal of a portion of the optical imaging device, and controls the optical imaging device to generate the image sensing signal again.

6. The optical imaging system according to claim 1, wherein the display further guides the user to place the finger on a sensing region of the optical imaging device.

7. The optical imaging system according to claim 1, further comprising:
    a touch panel electrically connected to the CPU and providing a touch function;
    a storage electrically connected to the CPU and storing data or a database; and
    a memory electrically connected to the CPU and functioning as a buffer upon calculation.

8. The optical imaging system according to claim 1, wherein the variable light field pertains to a structured light projection mode.

9. The optical imaging system according to claim 8, wherein the display comprises light emitting units, wherein: at a first time point, light emitting units of first portions of the light emitting units output first light patterns, so that the optical imaging device senses a first image; at a second time point, light emitting units of second portions of the light emitting units output second light patterns, so that the optical imaging device senses a second image; and at a third time point, light emitting units of third portions of the light emitting units output third light patterns, so that the optical imaging device senses a third image.

10. The optical imaging system according to claim 9, wherein the CPU obtains a three-dimensional biometrics characteristic image by calculating states of each of light spots of the first to third images and superimposing the first to third images.

11. The optical imaging system according to claim 1, wherein the CPU controls light emitting units of the display to output different colors of light rays to detect colors of a skin of the finger, and judges whether the finger is a counterfeit finger.

12. The optical imaging system according to claim 1, wherein the optical imaging device comprises:
- an image sensing chip comprising photo sensing units arranged in a two-dimensional array; and
- a micro-hole layer disposed on the image sensing chip and having one or multiple micro holes corresponding to the photo sensing units, wherein the photo sensing units sense the optical image of the finger through the one or multiple micro holes; and
- a transparent cover or a transparent cover assembly disposed over the micro-hole layer.

13. The optical imaging system according to claim 12, wherein light emitting units of the display are arranged in an array, and the one or multiple micro holes are disposed in one or multiple gaps between the light emitting units.

14. The optical imaging system according to claim 12, wherein the image sensing chip comprises:
- a substrate;
- the photo sensing units formed in the substrate;
- an inter-metal dielectric layer set and a metal connection layer disposed on the substrate and the photo sensing units;
- an upper metal layer disposed on the inter-metal dielectric layer set; and
- a protection layer disposed on the inter-metal dielectric layer set and the upper metal layer, wherein the upper metal layer obstructs partial light rays from the one or multiple micro holes to the photo sensing units.

15. The optical imaging system according to claim 12, wherein the micro-hole layer comprises a patterned optical substrate.

16. The optical imaging system according to claim 15, wherein the micro-hole layer further comprises an optical filter, wherein the optical filter is disposed in the patterned optical substrate, or between the image sensing chip and the patterned optical substrate.

17. The optical imaging system according to claim 12, wherein the one or multiple micro holes correspond to the photo sensing units in a one-to-one, one-to-many or many-to-one manner.

18. The optical imaging system according to claim 12, wherein the transparent cover assembly is a portion of an organic light emitting diode (OLED) display or a micro light-emitting diode (LED) display.

19. The optical imaging system according to claim 1, wherein the CPU controls light emitting units of the display to output different wavelengths of light rays, and detects under-skin characteristics of the sensed finger according to that a skin of the finger has different absorptivities for different wavelengths of light rays.

* * * * *